United States Patent
Moslehi Bajestan et al.

(10) Patent No.: US 11,411,569 B2
(45) Date of Patent: Aug. 9, 2022

(54) CALIBRATION OF SAMPLING-BASED MULTIPLYING DELAY-LOCKED LOOP (MDLL)

(71) Applicant: Qualcomm Incorporated, San Diego, CA (US)

(72) Inventors: Masoud Moslehi Bajestan, San Diego, CA (US); Marco Zanuso, Encinitas, CA (US); Razak Hossain, San Diego, CA (US); Hasnain Lakdawala, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/357,478

(22) Filed: Jun. 24, 2021

(65) Prior Publication Data

US 2021/0409029 A1    Dec. 30, 2021

Related U.S. Application Data

(60) Provisional application No. 63/046,679, filed on Jun. 30, 2020.

(51) Int. Cl.
*H03L 7/099*    (2006.01)
*H03L 7/091*    (2006.01)
(Continued)

(52) U.S. Cl.
CPC .......... *H03L 7/0997* (2013.01); *H03L 7/081* (2013.01); *H03L 7/091* (2013.01); *H03L 7/0992* (2013.01); *H03L 7/1803* (2013.01)

(58) Field of Classification Search
CPC ....... H03L 7/081; H03L 7/099; H03L 7/0995; H03L 7/0997; H03L 7/1803
See application file for complete search history.

(56) References Cited

U.S. PATENT DOCUMENTS 5,809,431 A *  9/1998  Bustamante ......... H04B 7/0491
                                                455/562.1
8,384,456 B1 *  2/2013  Ramaswamy ........ H03L 7/0816
                                                327/158
(Continued)

OTHER PUBLICATIONS

Elshazly A., et al., "Clock Multiplication Techniques Using Digital Multiplying Delay-Locked Loops", IEEE Journal of Solid-State Circuits, IEEE, USA, vol. 48, No. 6, Jun. 1, 2013 (Jun. 1, 2013), pp. 1416-1428.

(Continued)

*Primary Examiner* — Diana J. Cheng
(74) *Attorney, Agent, or Firm* — Colby Nipper; QUALCOMM Incorporated

(57) ABSTRACT

An apparatus implements a multiplying delay-locked loop (MDLL) including a sampler to be calibrated. In an example aspect, an apparatus includes an MDLL and a sampler calibrator. The MDLL includes a locked-loop feedforward path with a sampler, a control output, a feedback input, and a reference input coupled to a reference signal source. The MDLL also includes a VCO, a multiplexer, and a divider. The VCO includes a VCO input, a VCO output, and a control input coupled to the control output. The multiplexer includes a first input coupled to the reference signal source, a second input coupled to the VCO output, and an output coupled to the VCO input. The divider is coupled between the VCO output and the feedback input. The sampler calibrator includes a first input coupled to the reference signal source, a second input coupled to the VCO output, and an output coupled to the sampler.

31 Claims, 11 Drawing Sheets

(51) Int. Cl.
  *H03L 7/18*     (2006.01)
  *H03L 7/081*    (2006.01)

(56) References Cited

U.S. PATENT DOCUMENTS

| | | |
|---|---|---|
| 8,427,205 B1 * | 4/2013 | Nagaraj ................ H03L 7/0814 |
| | | 327/105 |
| 9,520,888 B1 | 12/2016 | Chettuvetty et al. |
| 2017/0205772 A1 | 7/2017 | Burg et al. |
| 2019/0214976 A1 | 7/2019 | Wu et al. |
| 2019/0326915 A1 | 10/2019 | Moslehi Bajestan et al. |

OTHER PUBLICATIONS

International Search Report and Written Opinion—PCT/US2021/039181—ISA/EPO—dated Oct. 15, 2021, 16 pages.
Jingcheng T., et al., "A 2.2-GHz 3.2-mW DTC-Free Sampling ΔΣ Fractional-N PLL With -110-dBc/Hz In-Band Phase Noise and -246-dB FoM and -83-dBc Reference Spur", IEEE Transactions on Circuits and Systems I: Regular Papers, IEEE, US, vol. 66, No. 9, (Sep. 1, 2019), pp. 3317-3329.

\* cited by examiner

CALIBRATION OF SAMPLING-BASED MULTIPLYING DELAY-LOCKED LOOP (MDLL)

CROSS-REFERENCE TO RELATED APPLICATION

This application claims the benefit of U.S. Provisional Application No. 63/046,679, filed 30 Jun. 2020, the disclosure of which is hereby incorporated by reference in its entirety herein.

TECHNICAL FIELD

This disclosure relates generally to electronic devices and, more specifically, to a multiplying delay-locked loop (MDLL) including a sampler that can be calibrated.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, programmable thermostats, automotive electronics, robotics, medical equipment, intelligent devices embedded in other machines like refrigerators and industrial tools, Internet-of-Things (IoT) devices, and the like. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among separate or remote electronic devices using wireless or wired signals that are transmitted over one or more networks, such as the Internet or a cellular network. Electronic communications can also include those exchanged between or among different printed circuit boards, modules, chips, or even cores or other circuit portions of a given integrated circuit that are located within a housing of a single electronic device. Regardless, electronic communications are usually accomplished by generating or propagating electrical or electromagnetic signals. Such electronic communications are typically made using at least one signal that is designed to have a specified characteristic, such as a particular frequency. Generally, the signals of electronic communications are more likely to be correctly transmitted and received, as well as properly interpreted, if the specified characteristic is accurately and reliably produced.

With regard to a frequency characteristic of a signal, a frequency synthesizer can be used to create, or synthesize, a desired frequency. Thus, electronic devices employ frequency synthesizers to synthesize signals having desired frequencies. Typically, a frequency synthesizer includes a frequency generator, such as a locked loop (LL). Examples of locked loops include a phase-locked loop (PLL), a delay-locked loop (DLL), and a multiplying DLL (MDLL). In operation, a locked-loop receives a reference signal having a reference frequency and applies the reference signal to a loop with a feedback control mechanism. Using a feedback loop, the circuitry of the locked loop generates an output signal that oscillates at a desired frequency based at least on the reference frequency of the reference signal.

A locked loop of an electronic device therefore outputs an oscillating signal having some synthesized frequency. The electronic device can use the synthesized frequency of the oscillating signal in one or more stages of a communication scenario. Example stages for communicating a signal include generating, transmitting, receiving, and interpreting a communication signal. In an example signal-generation stage, a frequency synthesized by a locked loop can be used to modulate a communication signal. Here, the modulation entails encoding or adding information—such as a text and an associated photograph—to the communication signal or signals. In an example signal-transmission stage, a frequency synthesized by a locked loop can be employed to upconvert a frequency of a modulated communication signal using a mixer that is part of a transmit chain. With an up-conversion operation, the mixer increases a frequency of the communication signal. The increased frequency enables the communication signal to be transmitted wirelessly as a radio-frequency (RF) electromagnetic (EM) signal that propagates in free space, e.g., between a smartphone and a cellular base station.

A locked loop can also be used with the stages of a reception side of a typical communication scenario. For example, a locked loop can be used to down-convert a frequency of a received communication signal using a mixer that is part of a receive chain. After down-conversion, a locked loop can be used to demodulate the down-converted communication signal to interpret the signal and thereby recover encoded information—such as the text message and the associated photograph. Additionally, a locked loop can be used to produce a synthesized frequency for a clock signal that controls a rate of operation of clock-synchronized circuitry of an integrated circuit. Examples of an integrated circuit that may use a clock signal for synchronized operations include a system-on-chip (SoC), a modem baseband that processes a communication signal, and a graphics chip that processes video data that is being displayed to a user.

Thus, a locked loop can be employed in any of multiple stages of a communication scenario to support electronic communications with electronic devices or in synchronously operated circuit scenarios to support coordinated interoperations among different components of electronic devices. However, a degree to which a locked loop is both stable and accurate and produces a clean, synthesized frequency can vary. This variability can adversely impact the electronic communications or coordinated interoperations that are being supported by the locked loop. Consequently, electrical engineers and other designers of electronic devices strive to improve the functionality, stability, and output signals of the locked loops that are used to facilitate the electronic communications and high-speed synchronous operations of electronic devices.

SUMMARY

A multiplying delay-locked loop (MDLL) is a component that can be at least part of a circuit that controls a frequency or phase characteristic of a signal. The circuitry of an MDLL can include a locked-loop feedforward path with a phase-frequency detector (PFD) and a sampler. The sampler creates a time offset between a reference signal and a feedback signal, and the time offset produces reference spurs at a voltage-controlled oscillator (VCO) output signal. To reduce or otherwise ameliorate the occurrence of reference spurs on the output signal, this document describes a sampler calibrator. In example implementations, the sampler calibrator is coupled to the sampler of the locked-loop feedforward path to tune the sampler so as to reduce the reference spurs. The sampler includes at least one sampler component, like a capacitor or a resistor, that establishes or affects a delay time of the sampler, such as a decay time for signals being processed by the sampler. The sampler calibrator can adjust an impedance value of the sampler component to change the delay time of the sampler. In example operations, the sampler calibrator generates a sampler calibration signal based on the reference signal and the VCO output signal. A phase detector, such as a bang-bang phase-detector (BBPD), of the sampler calibrator can detect a phase difference between the reference signal and the VCO output signal. The sampler calibrator outputs the sampler calibration signal to adjust the sampler component based on this phase difference. For example, the sampler calibrator can adjust the sampler component to substantially align an edge of the reference signal with an edge of the VCO output signal. This alignment can change the time offset, which is between the reference signal and the feedback signal, so as to substantially track, for instance, one-half a period of the VCO output signal. By changing the time offset, described techniques can substantially reduce reference spurs at the output signal of the MDLL. This reference spur reduction enables the MDLL to produce a higher-quality output signal having one or more targeted characteristics.

In an example aspect, an apparatus for calibrating an MDLL is disclosed. The apparatus includes an MDLL and a sampler calibrator. The MDLL includes a locked-loop feedforward path, a voltage-controlled oscillator (VCO), a multiplexer, and a divider. The locked-loop feedforward path includes a sampler, a control output node, a feedback input node, and a reference input node that is coupled to a reference signal source. The VCO includes a VCO input node, a VCO output node, and a control input node that is coupled to the control output node. The multiplexer includes a first input node, a second input node, and an output node. The first input node is coupled to the reference signal source, and the second input node is coupled to the VCO output node. The output node is coupled to the VCO input node. The divider includes a divider input node and a divider output node. The divider input node is coupled to the VCO output node, and the divider output node is coupled to the feedback input node. The sampler calibrator includes a first calibrator input node, a second calibrator input node, and a calibrator output node. The first calibrator input node is coupled to the reference signal source, and the second calibrator input node is coupled to the VCO output node. The calibrator output node is coupled to the sampler.

In an example aspect, an apparatus for calibrating an MDLL is disclosed. The apparatus includes a locked-loop feedforward path, a VCO, a divider, and a multiplexer. The locked-loop feedforward path includes a phase-frequency detector (PFD) configured to produce a phase indication signal based on a reference signal and a feedback signal. The locked-loop feedforward path also includes means for sampling the phase indication signal to produce a sampled signal. The VCO is coupled to the locked-loop feedforward path and configured to generate, responsive to the sampled signal, a VCO output signal at a VCO output node. The divider is coupled to the VCO output node and configured to produce the feedback signal based on the VCO output signal. The multiplexer is coupled to a VCO input node and configured to selectively forward the reference signal or the VCO output signal to the VCO input node. The apparatus also includes calibration means for calibrating the means for sampling based on the reference signal and the VCO output signal.

In an example aspect, a method for operating an MDLL is disclosed. The method includes producing a control signal based on a reference signal and a feedback signal, including sampling a signal indicative of a phase difference between the reference signal and the feedback signal. The method also includes running a VCO to produce a VCO output signal responsive to the control signal. The method additionally includes producing the feedback signal based on the VCO output signal. The method also includes generating a sampler calibration signal based on the reference signal and the VCO output signal. The method further includes modifying the sampling based on the sampler calibration signal.

In an example aspect, an apparatus for calibrating an MDLL is disclosed. The apparatus includes a multiplying DLL (MDLL) and a sampler calibrator. The MDLL includes a VCO, a divider, a phase-frequency detector (PFD), and a sampler. The VCO is configured to generate a VCO output signal based on the VCO output signal and a reference signal and responsive to a control signal. The VCO output signal has an output frequency that is a multiple of a reference frequency of the reference signal. The divider is configured to produce a feedback signal based on the VCO output signal. The PFD is configured to produce a phase indication signal based on the reference signal and the feedback signal. The sampler is configured to produce a sampled signal based on the phase indication signal, and the control signal is based on the sampled signal. The sampler calibrator is configured to provide a sampler calibration signal to the sampler based on the reference signal and the VCO output signal.

DETAILED DESCRIPTION

Figure 1:
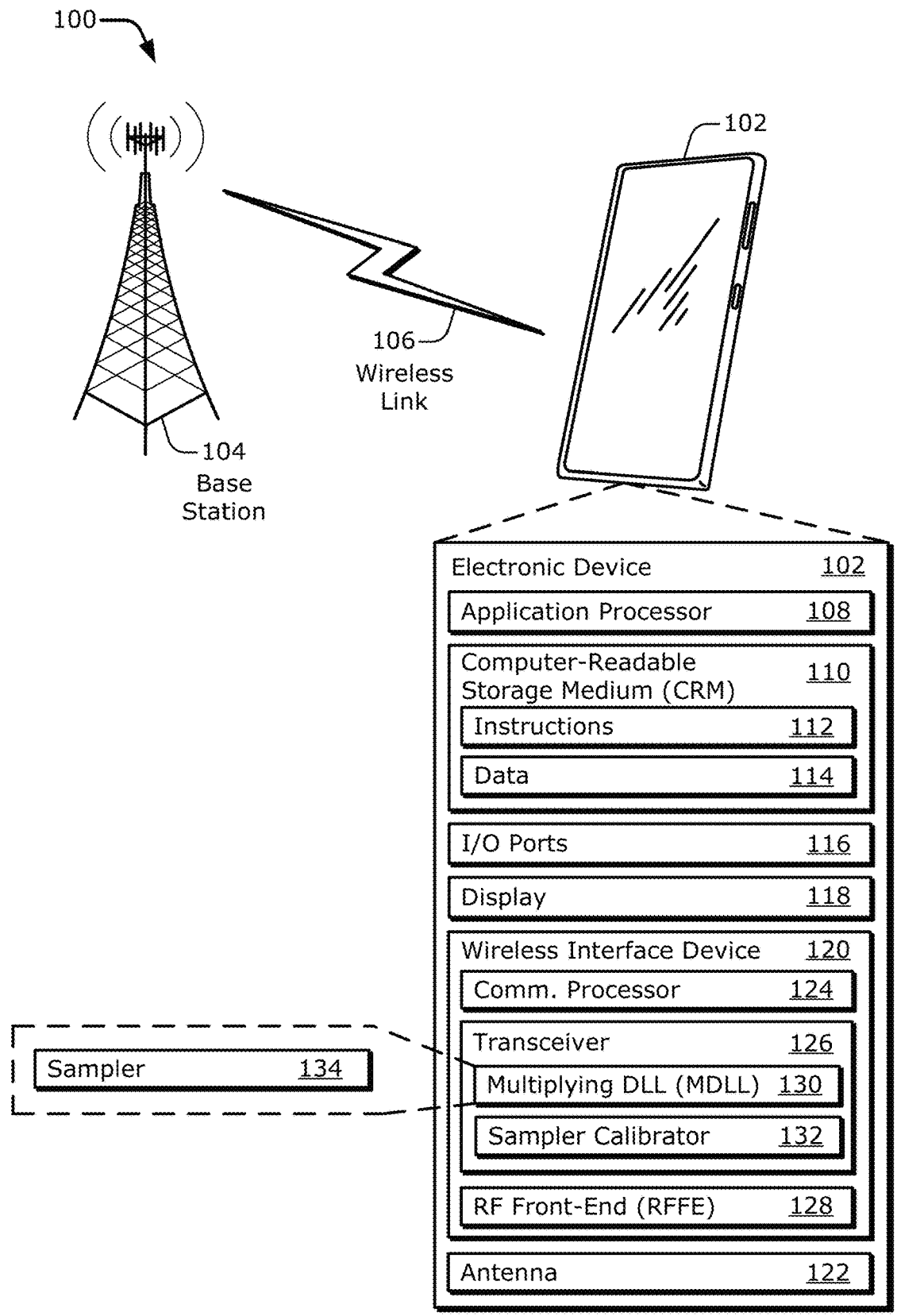
FIG. 1 illustrates an environment with an example electronic device having a wireless interface device, which includes a transceiver having a multiplying delay-locked loop (MDLL) and a sampler calibrator.

Electronic devices use oscillating signals that rise and fall at some frequency. The frequency characteristic of a signal can be constant or can be changing responsive to some factor, such as a power control parameter or a desired frequency modulation. For example, electronic devices can use oscillating signals to control a rate at which processing operations are performed, such as with a clock signal and synchronized circuitry. Examples of circuitry that can be synchronized include a central processing unit (CPU), a graphics processing unit (GPU), and a system-on-chip (SoC). Additionally or alternatively, electronic devices can use oscillating signals to facilitate transmission and reception of signals in different communication scenarios. For instance, oscillating signals can be used with mixers that perform frequency translations for up-conversion or down-conversion operations to produce signals with higher or lower frequencies, respectively. Further, oscillating signals can be used to encode information by applying a frequency-based modulation to a signal.

These oscillating signals can be generated by a frequency synthesizer, which can include circuitry implementing some type of locked loop. A frequency synthesizer can produce an output signal having a synthesized frequency that is based at least on a reference frequency of a reference signal and a divider value "D." The divider value at least partly controls how much the frequency synthesizer changes, such as increases or multiplies, the reference frequency to produce the synthesized frequency of the output signal. Example types of locked loops include a phase-locked loop (PLL), a delay-locked loop (DLL), a sampling DLL (MDLL), and so forth. The accuracy and stability of frequency synthesizers that are based on locked loops are partially contingent on performance of the underlying circuitry, such as a feedback loop of an MDLL or a feedforward path of the MDLL.

In addition to a frequency characteristic, a signal can have a phase characteristic. A frequency characteristic pertains to how many times a signal oscillates (e.g., reaches a peak value) in a given time period, such as each second. A phase characteristic pertains to when a peak value of a given signal is reached relative to a peak value of another signal or relative to one or more other peak values of the same given signal. The phase characteristic can therefore reflect how regularly or accurately a signal is able to reproduce a peak value over time. To use a signal for electronic communications or synchronized operations, a frequency or a phase of the signal can be established, modified, or stabilized. An MDLL can be realized as at least part of a circuit that adjusts a frequency or a phase of a signal.

Generally, an MDLL can be implemented to provide different functionalities, such as timing alignment or frequency multiplication. An MDLL can multiply a frequency of a signal by some integer. For example, an MDLL accepts an input signal having an input frequency and provides an output signal having an output frequency that is a multiple of the input frequency based on a multiplication factor. An MDLL can include a locked-loop feedforward path, a voltage-controlled oscillator (VCO), a multiplexer, and a divider. The locked-loop feedforward path at least partially controls operation of the VCO, which may be implemented as a ring VCO. The, e.g., ring VCO produces a VCO output signal based on a VCO input signal. Using a feedback mechanism, the VCO input signal is based on the VCO output signal. The VCO input signal can also be based on a reference signal because the VCO input signal can be created using edges of the output signal and at least one edge of the reference signal that occasionally (e.g., periodically) replaces an edge of the VCO signal. This edge replacement serves to realign the phase of the ring VCO of the MDLL. The multiplexer can control the edge replacement for the VCO input signal.

During operation, the ring VCO produces some amount of phase noise, which means that a phase of the VCO output signal varies even when a phase of the VCO input signal does not vary. The phase realignment in MDLL can, however, filter VCO phase noise with a bandwidth—or a speed—that is appreciably faster than can be achieved by a phase-locked loop (PLL). Nonetheless, the filtering bandwidth of the MDLL for phase noise caused by the ring VCO may not be sufficient in some applications. This insufficiency increases as the reference frequency decreases or as the multiplication factor increases, which insufficiency is exacerbated as both occur. Thus, filtering ring VCO phase noise can be more problematic if a lower-frequency crystal oscillator (XO) is to be used to provide a reference signal with a reference frequency or if a greater frequency multiplication between the input and the output of the MDLL is desired.

With an MDLL, filtering of the VCO phase noise can be increased based on a circuit design of the locked-loop feedforward path. In some scenarios, a locked-loop feedforward path can employ a phase-frequency detector (PFD) in combination with a charge pump (CP). This combination can, however, limit the maximum filtering bandwidth achievable by the MDLL due to the PFD and CP noise. To address this limitation of the PFD and charge pump combination, the filtering bandwidth can be increased by instead employing a PFD in conjunction with a sampler as part of the locked-loop feedforward path. This is because the combination of PFD and sampler provides an appreciably higher phase-detection gain, leading to relatively low in-band phase noise performance.

Thus, on the one hand, using a sampling-based locked-loop feedforward path can increase the bandwidth of the feedback loop in the MDLL and therefore increase the filtering of the phase noise produced by the ring VCO. On the other hand, in the absence of mitigation, the inclusion of a sampler in the locked-loop feedforward path results in reference spurs (e.g., spurious signals derived from a reference signal) at the output of the MDLL. These reference spurs create a less pure or "dirtier" MDLL output signal. This impure output signal causes signals produced using the MDLL to have a lower quality, and the lower quality can adversely impact both electronic communications and synchronous circuitry operations that depend on the MDLL output signal.

To address these issues, including at least ameliorating the reference spurs, a sampler calibrator can be coupled to a sampling-based MDLL as described herein. Example implementations include an MDLL and a sampler calibrator that is coupled to the MDLL. The MDLL can include a sampling-based locked-loop feedforward path, a ring VCO, a multiplexer, and a divider. The sampling-based locked-loop feedforward path can include a PFD, a sampler, a transconductance amplifier, and a loop filter. Using the sampler in the locked-loop feedforward path can create a time offset between a reference signal and a feedback signal produced by the divider. Without the sampler calibrator, this time offset, which can persist even after the MDLL locks, causes reference spurs at the MDLL output. The reference spurs reduce the purity or accuracy of an output signal of the MDLL. The reference spurs can therefore adversely impact a downstream component that is to use the output signal of the MDLL.

In example operations, the locked-loop feedforward path accepts as input the reference signal and the feedback signal. Based on a phase difference between these two signals as determined by the PFD, the locked-loop feedforward path produces a control signal using the sampler. An operational speed of the ring VCO depends at least partly on the control signal. Responsive to the control signal, the ring VCO produces a VCO output signal, which can also be used as the MDLL output signal. The multiplexer accepts as two input signals the reference signal and the VCO output signal. The multiplexer forwards the VCO output signal as a multiplexer output signal with occasional edge replacements based on the reference signal to "reset" the ring VCO to an edge of the reference signal. The multiplexer output signal is coupled to the input of the ring VCO. The divider produces the feedback signal based on the VCO output signal.

While the MDLL is operating, a time offset between the reference signal and the feedback signal can develop due at least partially to the sampler. Absent compensation from a sampler calibrator, this time offset results in appreciable reference spurs in the VCO output signal. To counteract formation of the reference spurs, the sampler calibrator operates in conjunction with the MDLL by calibrating the sampler of the locked-loop feedforward path to reduce the reference spurs. Described calibration techniques can be performed, for instance, in the background to facilitate low reference-spur performance over process-voltage-temperature (PVT) variations.

The sampler includes at least one sampler component that at least partially establishes a delay rate or response time of the sampler. Examples of such sampler components include a resistor, a capacitor, a combination thereof, and so forth. The sampler calibrator tunes the sampler component to establish a time offset that at least reduces the presence of reference spurs. For example, the sampler calibrator can adjust the sampler component so as to substantially align edges of the reference signal with edges of the VCO output signal. To do so, the sampler calibrator accepts as input the reference signal and the VCO output signal. Based on these two signals, the sampler calibrator generates a sampler calibration signal. The sampler calibration signal is coupled to the at least one sampler component, such as an adjustable capacitor, that can be tuned until the edges of the reference signal and the edges of the VCO output signal are substantially aligned.

In some cases, the sampler calibrator includes a phase detector (PD), such as a bang-bang phase-detector (BBPD), an accumulator, and a digital-to-analog converter (DAC). The BBPD accepts the reference signal and the VCO output signal and produces a signal indicative of a phase difference between the two signals. Based on this signal, as tracked by the accumulator, the DAC can adjust the sampler component to change the time offset of the sampler. The sampler calibrator adjusts operation of the sampler such that the time offset at least partially tracks the frequency of the ring VCO. For example, the time offset can be changed to be substantially equal to one-half a period of the VCO output signal.

The sampler calibrator can therefore adjust a sampler component of a sampler of locked-loop feedforward path of an MDLL based on the reference signal and the VCO output signal. The sampler calibrator can change a time offset between the reference signal and the feedback signal, which is based on the VCO output signal, to reduce reference spurs on the VCO output signal. The VCO output signal can be used as an output signal of the MDLL. Example implementations of an MDLL and sampler calibrator therefore enable the MDLL to have the lower VCO phase noise of a sampler-based locked-loop feedforward path without being appreciably impacted by substantial reference spurs at the output of the MDLL. Thus, the sampler calibrator can increase the quality of a signal output by the MDLL for use with electronic communications, synchronous circuit operations, and so forth.

FIG. 1 illustrates an example environment 100 with an electronic device 102 having a wireless interface device 120, which includes a transceiver 126 having a multiplying delay-locked loop 130 (MDLL 130) and a sampler calibrator 132. As shown, the MDLL 130 includes at least one sampler 134. Other example components of the MDLL 130 are described below, starting with FIG. 3. In the environment 100, the example electronic device 102 communicates with a base station 104 through a wireless link 106. In FIG. 1, the electronic device 102 is depicted as a smartphone. The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX™); a Bluetooth™ standard; and so forth. In some implementations, the wireless link 106 may provide power wirelessly, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The wireless interface device 120 provides connectivity to respective networks and peer devices via a wireless link, which may be configured in a manner similar to or different from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118. The presentation can be based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The transceiver 126 can include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a superheterodyne architecture). Generally, the transceiver 126 includes filters, switches, amplifiers, mixers, and so forth for routing and conditioning signals that are transmitted or received via the antenna 122. Thus, in addition to or instead of the illustrated components, the transceiver 126 can include other components, such as an analog-to-digital converter (ADC) or a digital-to-analog converter (DAC). In operation, an ADC can convert from analog signals to digital signals, and a DAC can convert from digital signals to analog signals. An ADC or a DAC can be implemented as part of the communication processor 124, as part of the transceiver 126, or separately from both of them (e.g., as another part of an SoC or as part of the application processor 108).

Figure 2:
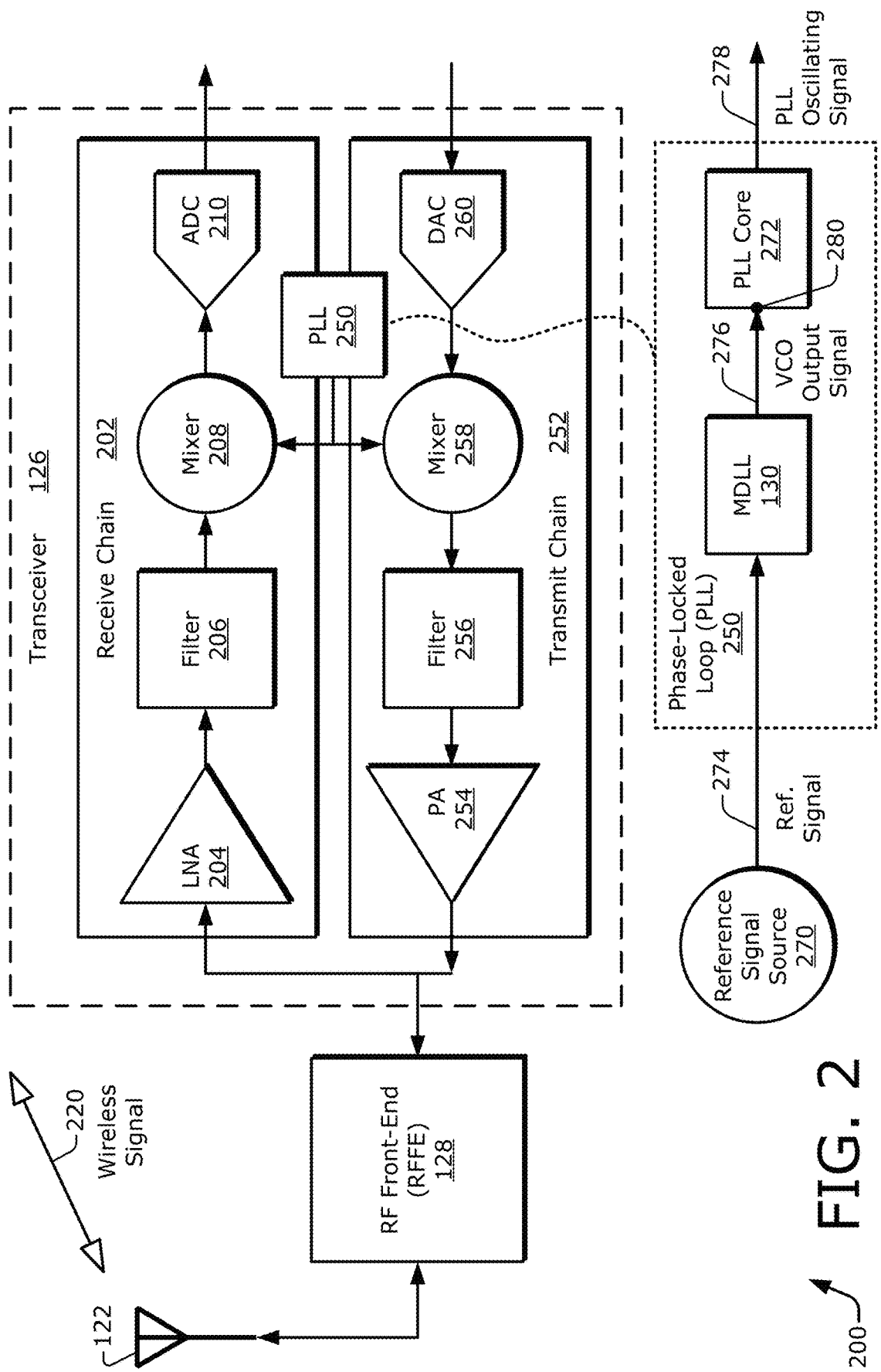
FIG. 2 illustrates an example transceiver including a phase-locked loop (PLL) that is fed by an MDLL, which can be coupled to a sampler calibrator.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

As shown, the transceiver 126 includes at least one MDLL 130 and at least one sampler calibrator 132. Described implementations of an MDLL 130 in conjunction with a sampler calibrator 132 can, however, additionally or alternatively be employed elsewhere. For example, an MDLL 130 or a sampler calibrator 132 can be deployed in other portions of the wireless interface device 120 (e.g., as part of the communication processor 124 or the RF front-end 128) or in other portions of the electronic device 102 generally (e.g., as a clock generator or other frequency synthesizer of the application processor 108 or an SoC).

In example implementations, the MDLL 130 includes at least one sampler 134. The MDLL 130 can multiply a frequency of an input signal in accordance with a multiplication factor to produce an output signal with a multiplied frequency. The sampler calibrator 132 is coupled to the sampler 134 of the MDLL 130. In example operations, the sampler calibrator 132 tunes the sampler 134 to reduce reference spurs on an output signal of the MDLL 130. Additional aspects of the wireless interface device 120, including with regard to the MDLL 130, are described below with reference to FIG. 2. Example implementations of the MDLL 130 in conjunction with the sampler calibrator 132 are then described, starting with FIG. 3. Example interactions between the MDLL 130 and the sampler calibrator 132 are described further, starting with FIG. 4.

FIG. 2 illustrates, at 200 generally, an example transceiver 126 including a phase-locked loop 250 (PLL 250) that can operate with an MDLL 130. FIG. 2 further depicts an antenna 122, an RF front-end 128, a reference signal source 270, and an exploded view of an example PLL 250, which includes the MDLL 130. The reference signal source 270 and the PLL 250 are described below. As illustrated from left to right in FIG. 2, the antenna 122 is coupled to the RF front-end 128, and the RF front-end 128 is coupled to the transceiver 126. The transceiver 126 is coupled to the communication processor 124 (e.g., of FIG. 1) via an ADC 210 or a DAC 260.

The example RF front-end 128 can include at least one antenna feed line (not separately shown) coupling the antenna 122 to the transceiver 126. The example transceiver 126 includes at least one receive chain 202 and at least one transmit chain 252. Although only one RF front-end 128 and one transceiver 126 are explicitly shown at 200, an electronic device 102, or a wireless interface device 120 thereof, can include multiple instances of any or all such components (including one or more communication processors 124). Also, although only certain components are explicitly depicted in FIG. 2 and are shown coupled together in a particular manner, a wireless interface device 120 or the transceiver 126 thereof may include other non-illustrated components, more or fewer components, differently coupled arrangements of components, and so forth.

In some implementations, the RF front-end 128 couples the antenna 122 to the transceiver 126 via the antenna feed line (not shown). Thus, in operation, the antenna feed line propagates a signal between the antenna 122 and the transceiver 126. During or as part of the propagation, the antenna feed line can condition the propagating signal. The antenna feed line can condition a propagating signal using, for example, a filter, an amplifier (e.g., a power amplifier or a low-noise amplifier), an N-plexer, a phase shifter, and so forth.

In example implementations, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a mixer 208 for frequency down-conversion, and the ADC 210. The transmit chain 252 includes a power amplifier 254 (PA 254), a filter 256, a mixer 258 for frequency up-conversion, and the DAC 260. However, the receive chain 202 or the transmit chain 252 can include other components—such as additional amplifiers or filters, multiple mixers, one or more buffers, or at least one local oscillator—that are electrically disposed anywhere along the depicted receive and transmit chains. The receive chain 202 is coupled between the RF front-end 128 and the communication processor 124, e.g., via the low-noise amplifier 204 and the ADC 210, respectively. The transmit chain 252 is coupled between the RF front-end 128 and the communication processor 124, e.g., via the power amplifier 254 and the DAC 260, respectively. The transceiver 126 can also include at least one PLL 250, one PLL for each transmit/receive chain pair, one PLL per transmit chain and one PLL per receive chain, multiple PLLs, and so forth.

As shown for the receive chain 202, the antenna 122 is coupled to the low-noise amplifier 204 via the RF front-end 128, and the low-noise amplifier 204 is coupled to the filter 206. The filter 206 is coupled to the mixer 208, and the mixer 208 is coupled to the ADC 210. The ADC 210 is in turn coupled to the communication processor 124. For reception operations, a received wireless signal 220 propagates through the receive chain 202 from the low-noise amplifier 204 to the ADC 210. As shown for the transmit chain 252, the communication processor 124 is coupled to the DAC 260, and the DAC 260 is coupled to the mixer 258. The mixer 258 is coupled to the filter 256, and the filter 256 is coupled to the power amplifier 254. The power amplifier 254 is coupled to the antenna 122 via the RF front-end 128. Although only one receive chain 202 and one transmit chain 252 are explicitly shown, an electronic device 102, or a transceiver 126 thereof, can include multiple instances of either or both components.

The PLL 250 is coupled to at least one of the mixer 208 or the mixer 258. For signal reception, the mixer 208 can perform frequency down-conversion on a signal filtered by the filter 206 in a single conversion step, or through multiple conversion steps, using the PLL 250, which generates a signal having a synthesized frequency. For signal transmission, the mixer 258 upconverts an analog signal accepted from the DAC 260 to a higher frequency, such as an RF frequency, to produce an RF signal having a target synthesized frequency using a signal generated by the PLL 250. The PLL 250 is depicted in FIG. 2 as being part of a transceiver 126 to support frequency translation or modulation operations by a mixer of at least one transmit or receive chain. However, a PLL 250 can be deployed in other portions of an electronic device, can be used in other manners or to provide other functionality, can be coupled to different components, and so forth. Examples of other functionality and applications include radar signal generation, signal demodulation, clock generation, clock multiplication, and the like.

An example use case or application for an MDLL 130 is described next. An exploded view of an example PLL 250 is depicted in the lower portion of FIG. 2 in conjunction with the reference signal source 270. The PLL 250 accepts as input a reference signal 274 and produces a PLL oscillating signal 278 as output. The PLL 250 includes a phase-locked loop (PLL) core 272 and the MDLL 130. The reference signal source 270 produces and provides the reference signal 274 having a reference frequency. The reference signal source 270 can be realized using, for example, a crystal oscillator, a VCO, another locked-loop, other circuitry that creates or distributes an oscillating signal, some combination thereof, and so forth.

The PLL core 272 includes a reference signal input node 280. The PLL core 272 can accept this reference signal 274 as input at the reference signal input node 280 to produce the PLL oscillating signal 278. The quality of this PLL oscillating signal 278, however, can be relatively poor if the frequency difference between an input and an output of the PLL core 272 is too wide. Accordingly, performance of the PLL 250 can be improved by increasing a frequency of the signal input to the PLL core 272 at the reference signal input node 280. To do so, a multiplying DLL 130 can be coupled between the reference signal source 270 and the reference signal input node 280 of the PLL core 272.

Thus, in example operations, the multiplying DLL 130 accepts as input the reference signal 274 and multiples the reference frequency thereof to produce a signal (e.g., a VCO output signal 276) with a multiplied frequency (e.g., a multiplied reference signal). The multiplying DLL 130 provides a VCO output signal 276 having the multiplied frequency as the output signal of the MDLL 130. This higher-frequency VCO output signal 276 is then provided to the PLL core 272 as an input signal at the reference signal input node 280. This higher-frequency input signal enables the PLL core 272 to reach a target frequency with a lower multiple, and the PLL oscillating signal 278 therefore has a higher quality. The multiplying DLL 130 may alternatively be separate from the PLL 250 while still feeding the PLL core 272.

Thus, described implementations of the MDLL 130 can be used to feed a PLL core 272. However, the described MDLL 130 can be operated in other environments that are separate from a PLL to otherwise provide a signal with a stabilized frequency, with an accurate timing or phase, with a multiplied frequency, and so forth. Regardless of where the MDLL 130 is deployed, the MDLL 130 can be operated in combination with a sampler calibrator 132 to calibrate a sampler of the MDLL 130, which combination is described next with reference to FIG. 3.

Figure 3:
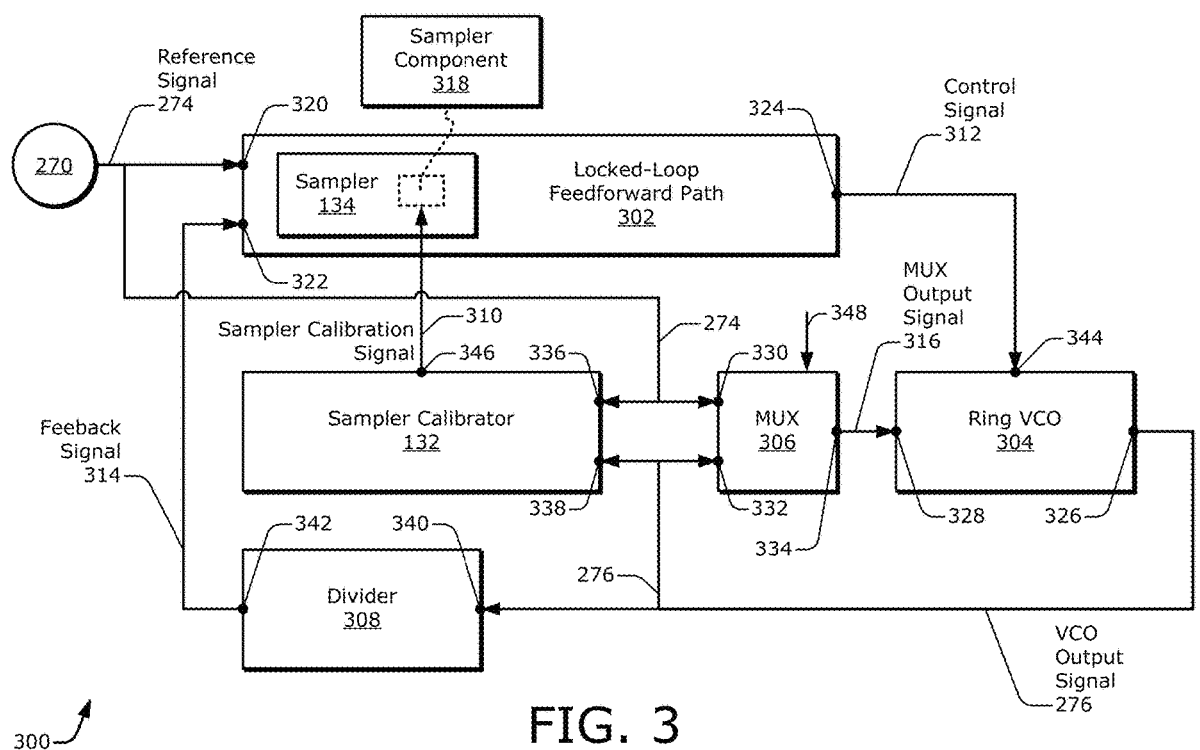
FIG. 3 illustrates an example sampler calibrator and example components of an MDLL, including a sampling-based locked-loop feedforward path and a voltage-controlled oscillator (VCO).

FIG. 3 illustrates, at 300 generally, an example sampler calibrator 132 and example components 302-308 of an MDLL 130 (e.g., of FIGS. 1 and 2). Thus, of the illustrated components, a locked-loop feedforward path 302, a ring voltage-controlled oscillator (VCO) 304, a multiplexer 306 (MUX 306), and a divider 308 may form at least part of an MDLL 130. Although depicted as a ring VCO 304 and described as such for certain example implementations, the VCO 304 can alternatively be implemented in different manners. As illustrated, the ring VCO 304 is coupled to the locked-loop feedforward path 302, the multiplexer 306, the divider 308, and the sampler calibrator 132. In addition to the ring VCO 304, the divider 308 is coupled to the locked-loop feedforward path 302. The locked-loop feedforward path 302, the multiplexer 306, and the sampler calibrator 132 are coupled to the reference signal source 270. The sampler calibrator 132 is also coupled to the locked-loop feedforward path 302.

In example implementations, the MDLL institutes an MDLL feedback loop with a signal flow through the locked-loop feedforward path 302, the ring VCO 304, the divider 308, and then "back" to the locked-loop feedforward path 302. The multiplexer 306 facilitates a ring VCO feedback loop that can selectively forward, to an input of the ring VCO 304, the VCO output signal 276 or at least an edge of the reference signal 274. The locked-loop feedforward path 302 includes at least one sampler component 318 of a sampler 134. The sampler calibrator 132 can tune the sampler component 318 using a sampler calibration signal 310 based on the reference signal 274 and the VCO output signal 276, as is described below.

The locked-loop feedforward path 302 includes a control output node 324, a feedback input node 322, and a reference input node 320 coupled to the reference signal source 270. The ring VCO 304 includes a ring VCO input node 328, a ring VCO output node 326, and a control input node 344 coupled to the control output node 324. The multiplexer 306 includes a first input node 330, a second input node 332, and an output node 334. The first input node 330 is coupled to the reference signal source 270, and the second input node 332 is coupled to the ring VCO output node 326. The output node 334 is coupled to the ring VCO input node 328. The divider 308 includes a divider input node 340 and a divider output node 342. The divider input node 340 is coupled to the ring VCO output node 326, and the divider output node 342 is coupled to the feedback input node 322.

Figure 7:
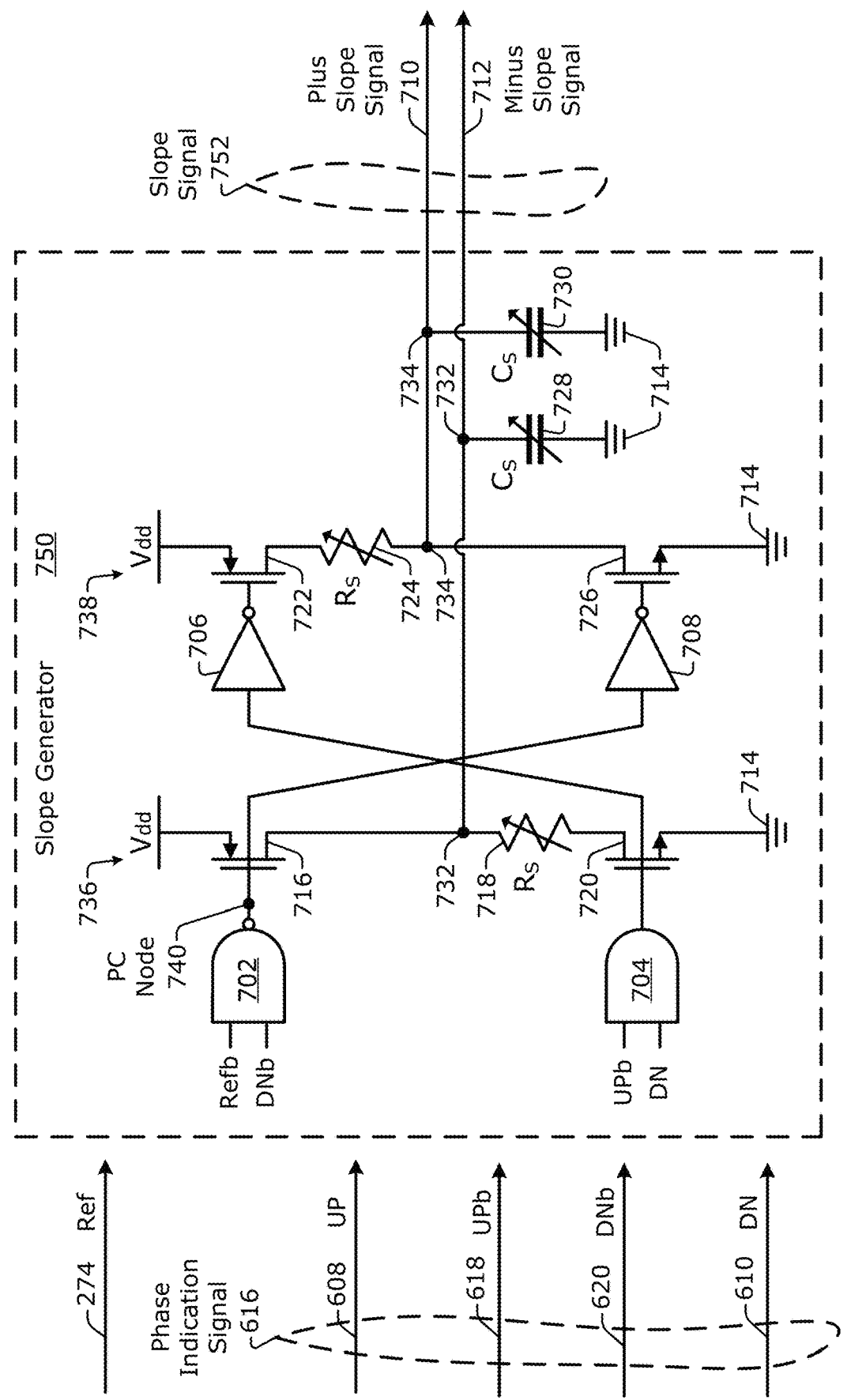
FIG. 7 illustrates example circuitry for a slope generator of a sampler of a sampling-based locked-loop feedforward path.
Figure 10:
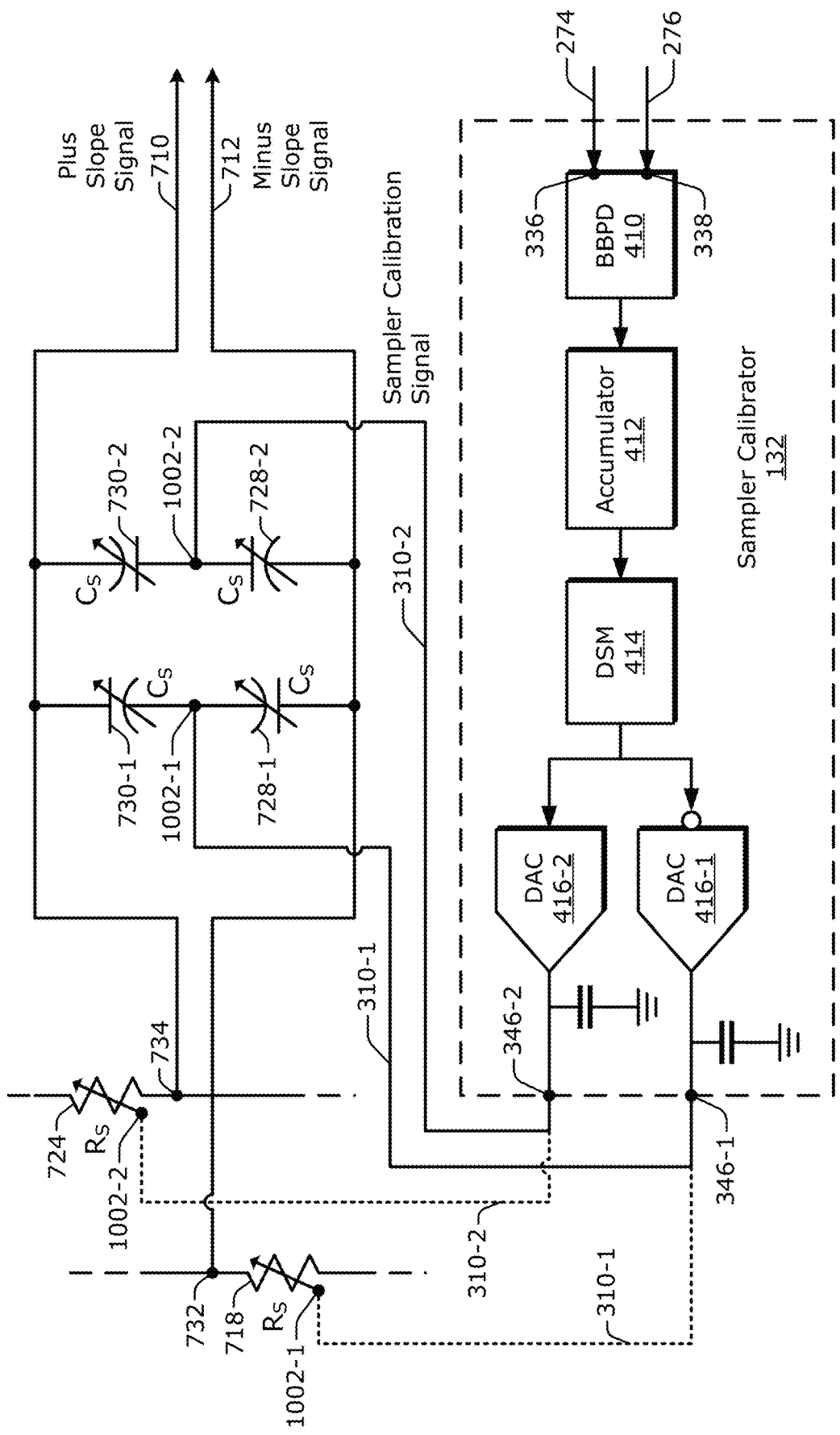
FIG. 10 illustrates example components of a sampler calibrator that is coupled to example components of a sampler component of a sampler portion of a sampling-based locked-loop feedforward path.

The sampler calibrator 132 includes a first calibrator input node 336, a second calibrator input node 338, and a calibrator output node 346. The first calibrator input node 336 is coupled to the reference signal source 270. The second calibrator input node 338 is coupled to the ring VCO output node 326. The calibrator output node 346 is coupled to the sampler 134, e.g., via the sampler component 318. Thus, the sampler 134 can include the sampler component 318, and the calibrator output node 346 can be coupled to the sampler component 318. In some cases, the at least one sampler component 318 can be realized as an adjustable capacitor or an adjustable resistor, as is depicted in FIGS. 7 and 10. As is indicated below, items linked by the disjunctive "or" embrace an "inclusive or" interpretation, unless context dictates otherwise. Accordingly, the at least one sampler component 318 can also include an adjustable capacitor and an adjustable resistor.

In example operations, the locked-loop feedforward path 302 produces a control signal 312 based on the reference signal 274 and a feedback signal 314. The locked-loop feedforward path 302 provides the control signal 312 to the ring VCO 304. The ring VCO 304 generates the VCO output signal 276 at the ring VCO output node 326 based on a multiplexer output signal 316 (MUX output signal 316) and responsive to the control signal 312. The ring VCO 304 provides the VCO output signal 276 to the sampler calibrator 132, the multiplexer 306, and the divider 308. The divider 308 produces the feedback signal 314 based on the VCO output signal 276.

The multiplexer 306 accepts the reference signal 274 via the first input node 330 and the VCO output signal 276 via the second input node 332. The multiplexer 306 selectively forwards, via the output node 334, the reference signal 274 or the VCO output signal 276 to the ring VCO input node 328 as the multiplexer output signal 316 responsive to a multiplexer selection signal 348. These signals and the selective forwarding are described further below with reference to FIGS. 4 and 5. The sampler calibrator 132 accepts the reference signal 274 via the first calibrator input node 336 and the VCO output signal 276 via the second calibrator input node 338. The sampler calibrator 132 generates the sampler calibration signal 310 based on the reference signal 274 and the VCO output signal 276.

The sampler calibrator 132 provides the sampler calibration signal 310 to the sampler component 318 of the sampler 134 via the calibrator output node 346. The sampler component 318 can be associated with at least one impedance. The impedance can comprise, for instance, a resistance, a capacitance, a combination thereof, and so forth. In some cases, a delay rate of the sampler 134 is based at least partly on the at least one impedance of the sampler component 318. The sampler calibrator 132 can adjust the at least one impedance based on the reference signal 274 provided by the reference signal source 270 and the VCO output signal 276 generated by the ring VCO 304. This adjustment is described further below with reference to FIGS. 4, 5, 7, and 10.

Figure 4:
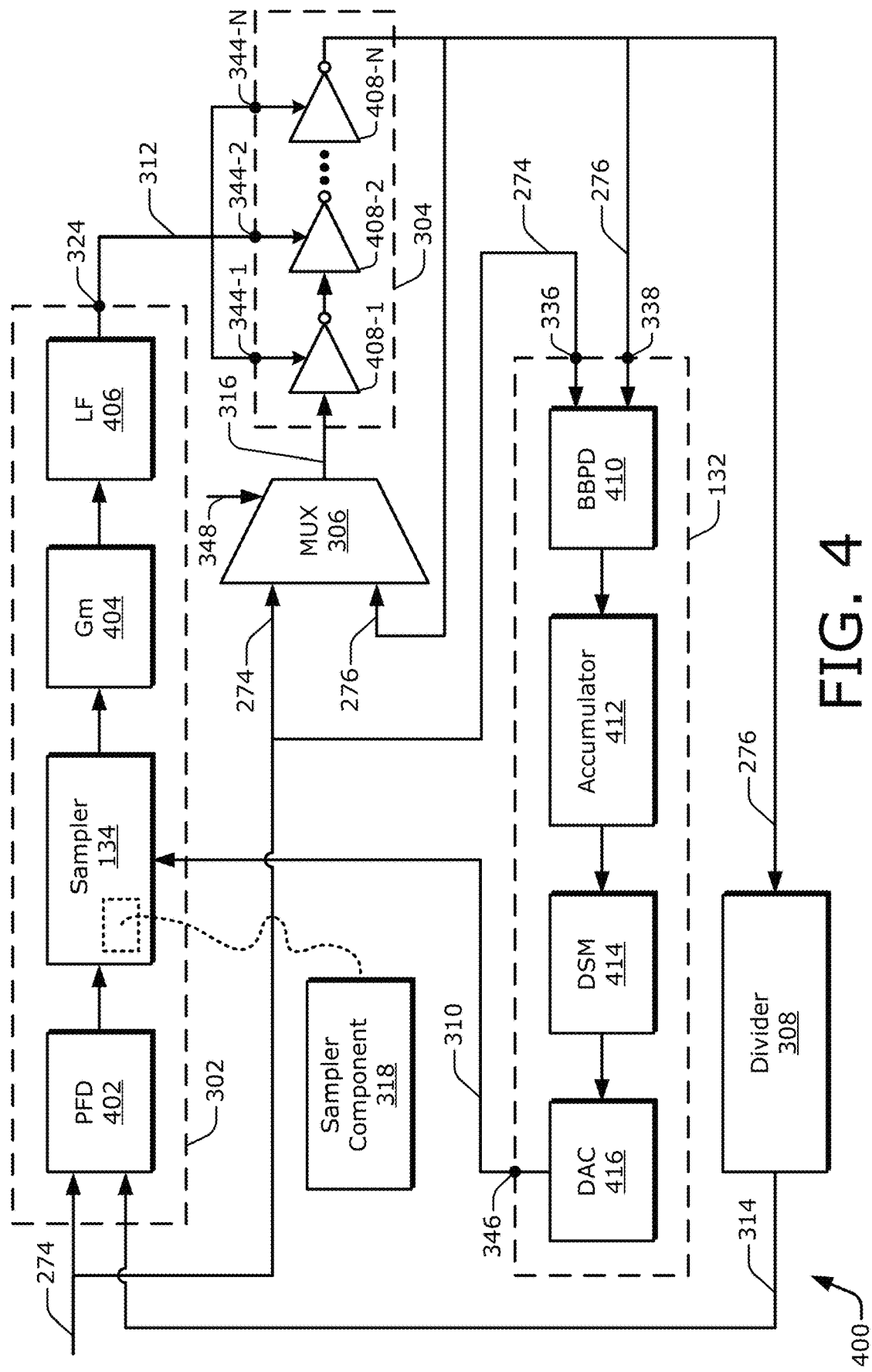
FIG. 4 illustrates example components of a sampling-based locked-loop feedforward path, of a VCO, and of a sampler calibrator.

FIG. 4 illustrates, at 400 generally, example components of some parts of the MDLL 130 and the sampler calibrator 132 that are described above with reference to FIG. 3. The locked-loop feedforward path 302 is illustrated with four components, including the sampler 134. Based on the presence of the sampler 134, the locked-loop feedforward path 302 can be described as a sampling-based locked-loop feedforward path 302. The ring VCO 304 is shown having "N" components, such as "N" delay elements, with "N" representing a positive integer. The sampler calibrator 132 is depicted with four components. Each of these three parts or components (e.g., the locked-loop feedforward path 302, the ring VCO 304, and the sampler calibrator 132) may, however, include more or fewer components, include different components, have differently interconnected components, and so forth. For clarity, some of the nodes identified in FIG. 3 are not explicitly indicated in FIG. 4 (e.g., the reference input node 320).

As illustrated, the locked-loop feedforward path 302 includes a phase-frequency detector 402 (PFD 402), the sampler 134, an amplifier that is realized as a transconductance amplifier 404 (Gm 404), and a loop filter 406 (LF 406). Between an input and an output of the locked-loop feedforward path 302, the PFD 402, the sampler 134, the Gm 404, and the loop filter 406 may be respectively coupled together in series. The sampler calibrator 132 includes a digital-to-analog converter (DAC 416), a delta-sigma modulator 414 (DSM 414), an accumulator 412, and a phase detector that can be realized as a bang-bang phase detector 410 (BBPD 410). Between an input and an output of the sampler calibrator 132, the BBPD 410, the accumulator 412, the DSM 414, and the DAC 416 may be respectively coupled together in series. The ring VCO 304 includes multiple delay elements, which can be realized as multiple inverters 408-1, 408-2, . . . , 408-N. Alternatively, the multiple delay elements may be realized with buffers or other elements having respective delay periods that are controllable by a voltage of the control signal 312. The multiple delay elements may be coupled together in series between an input and an output of the ring VCO 304.

In example implementations, the PFD 402 produces a phase indication signal based on the reference signal 274 and the feedback signal 314. The PFD 402 provides the phase indication signal to the sampler 134. Examples of a PFD 402 are described below with reference to FIG. 6. Using the sampler component 318, the sampler 134 obtains a sampled signal based on the phase indication signal. The sampler 134 can include a sampler input node, a sampler output node, a slope generator, and a sampling circuit (not shown in FIG. 4). The slope generator includes the sampler input node and generates a slope signal based on the phase indication signal provided by the PFD 402. The sampling circuit includes the sampler output node and is coupled to the slope generator. The sampling circuit produces a sampled signal based on the slope signal. Examples of the slope generator and the sampling circuit are described below with reference to FIGS. 7 and 8, respectively.

The sampler 134 forwards the sampled signal to the transconductance amplifier 404 (Gm 404). The Gm 404 amplifies the sampled signal and converts the signal from being voltage-based to being current-based. This produces a charge signal based on the sampled signal, and the Gm 404 provides the charge signal to the loop filter 406. The loop filter 406 generates the control signal 312, which is coupled to the multiple delay units of the ring VCO 304. Examples of the Gm 404 and the loop filter 406 are described below with reference to FIG. 9.

With regard to the sampler calibrator 132, the BBPD 410 accepts as input the reference signal 274 and the VCO output signal 276. The phase detector therefore detects a phase difference between the reference signal 274 and the VCO output signal 276 and provides a signal indicative of this phase difference to the accumulator 412. Using a bang-bang phase-detection mechanism, the BBPD 410 produces a binary signal indicative of whether a phase or edge of the reference signal 274 leads a phase or edge of the VCO output signal 276, or vice versa. The BBPD 410 issues the binary signal (e.g., +1 and −1) to an input of the accumulator 412.

The accumulator 412 accumulates (e.g., integrates) the binary signal (e.g., the binary phase difference) from the BBPD 410 over time. The accumulator 412 may be implemented with an up/down counter, for instance. The accumulator 412 therefore produces an accumulated or integrated version of the phase-indicative signal from the BBPD 410 and provides this integrated version (e.g., a digital value from a counter) of the signal to the DAC 416. The DAC 416 accepts the phase-indicative integrated signal and converts this signal from a digital version to an analog version. The analog version of this signal can be provided to the sampler 134 as the sampler calibration signal 310 to adjust the sampler component 318. Examples of the sampler component 318 and adjusting a sampler component 318 are described below with reference to FIGS. 7 and 10. The DSM 414 may be coupled between the accumulator 412 and the DAC 416 to increase a resolution of the DAC 416.

In some implementations, with regard to the locked-loop feedforward path 302, the sampler 134 includes a sampler input node and a sampler output node. The PFD 402 includes the feedback input node 322 (of FIG. 3), the reference input node 320, and a PFD output node. The PFD output node is coupled to the sampler input node. The loop filter 406 includes a loop filter input node and the control output node 324. The loop filter input node is coupled to the sampler output node. As shown in FIG. 4, the transconductance amplifier 404 (Gm 404) can be coupled between the sampler output node and the loop filter input node.

With regard to the ring VCO 304, the multiple delay elements of the ring VCO 304 can be implemented as multiple inverters 408-1 to 408-N that are coupled together in series between the ring VCO input node 328 (of FIG. 3) and the ring VCO output node 326. Thus, the control input node 344 (of FIG. 3) of the ring VCO 304 can include multiple control input nodes 344-1, 344-2, . . . , 344-N. Here, each respective inverter 408 of the multiple inverters 408-1 . . . 408-N includes a respective control input node 344 of the multiple control input nodes 344-1 . . . 344-N. The multiple delay elements may, however, be implemented using one or more other components, such as one or more buffers, one or more buffers with one or more inverters, and so forth. Further, the VCO 304 may be implemented without employing a ring circuit arrangement.

With regard to the sampler calibrator 132, the phase detector (e.g., the bang-bang phase detector (BBPD) 410) can include the first calibrator input node 336, the second calibrator input node 338, and a phase-detector output node that is coupled to the calibrator output node 346. As shown, one or more components (e.g., the accumulator 412, the DSM 414, or the DAC 416) can be coupled between the phase-detector output node and the calibrator output node 346. Thus, the DAC 416 can include the calibrator output node 346 and a DAC input node. The accumulator 412 can be coupled between the phase-detector output node of the BBPD 410 and the DAC input node. Further, the delta-sigma modulator (DSM) 414 can be coupled between the accumulator 412 and the DAC input node of the DAC 416.

Figure 5:
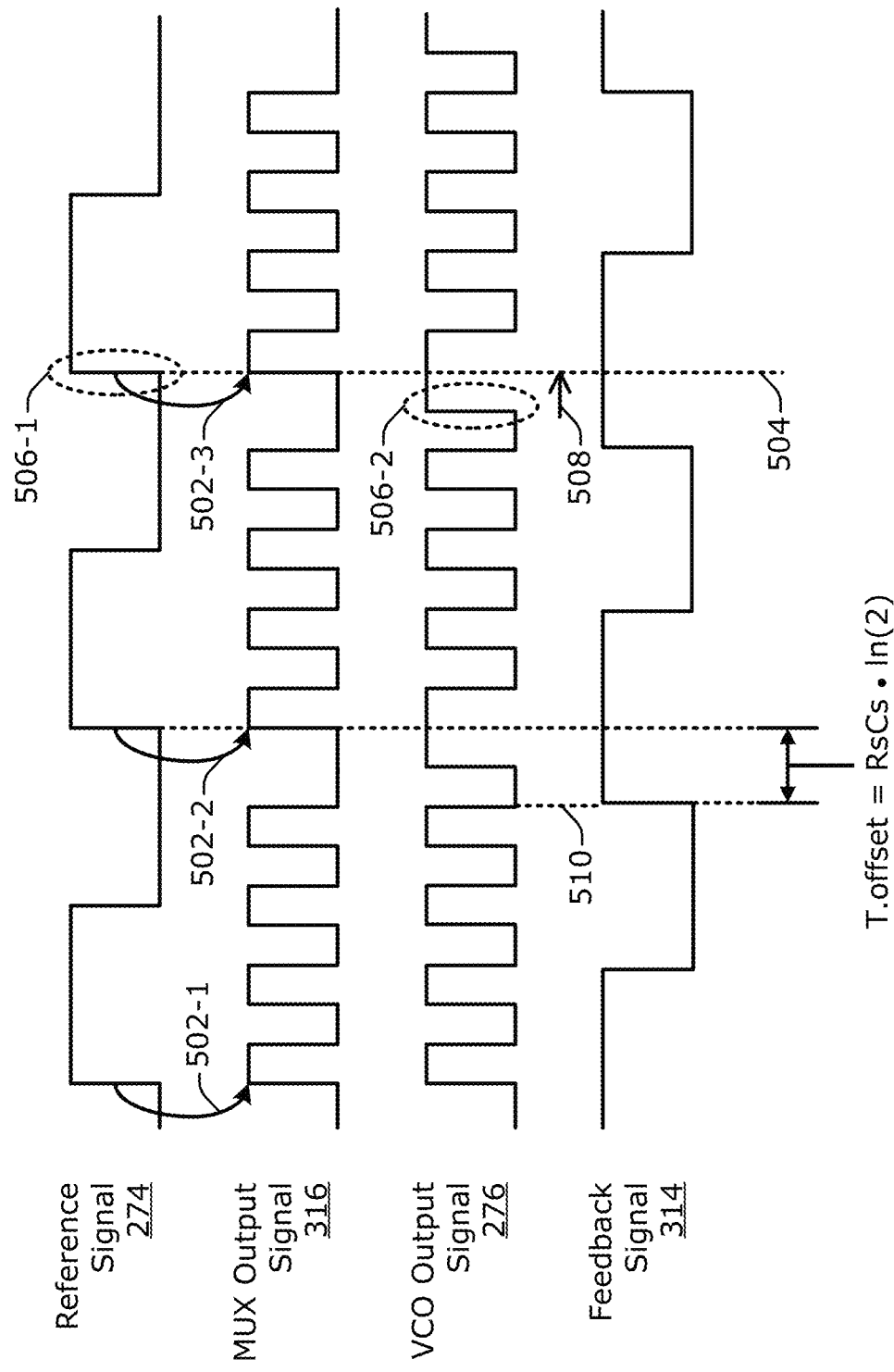
FIG. 5 depicts a signal diagram illustrating example signals for operating an MDLL in conjunction with a sampler calibrator.

FIG. 5 depicts a signal diagram 500 illustrating example signals for operating an MDLL 130 in conjunction with a sampler calibrator 132. Example waveforms are illustrated for a reference signal 274, a multiplexer output signal 316, a VCO output signal 276, and a feedback signal 314, which is output by the divider 308 (e.g., of FIGS. 3 and 4). The VCO output signal 276 represents a multiplied version of the reference signal 274 in the sense that an output frequency of the VCO output signal 276 is a multiple of a reference frequency of the reference signal 274. In the illustrated example, the output frequency is four times (4×) greater than the reference frequency.

The multiplexer 306 selectively forwards the reference signal 274 or the VCO output signal 276 to the ring VCO 304 as the multiplexer output signal 316 responsive to the multiplexer selection signal 348. Generally, the multiplexer 306 (e.g., of FIGS. 3 and 4) forwards the VCO output signal 276 as the multiplexer output signal 316 responsive to the multiplexer selection signal 348 having a first value. However, to "reset" the ring VCO 304 to the reference signal 274, the multiplexer 306 occasionally (e.g., intermittently, periodically, or in response to a waveform occurrence or another event) forwards at least a portion of the reference signal 274 to the ring VCO 304 as the multiplexer output signal 316 responsive to the multiplexer selection signal 348 having a second value. For example, responsive to each rising edge of the reference signal 274, the multiplexer selection signal 348 can cause the multiplexer 306 to forward the rising edge of the reference signal 274 to the ring VCO 304 as the multiplexer output signal 316 to reestablish the tracking of the reference signal 274 by the ring VCO 304. This is indicated in FIG. 5 at each arrow 502. The arrows 502-1, 502-2, and 502-3 indicate where three rising edges of the reference signal 274 are "injected" into the ring VCO 304 by the multiplexer 306 using the multiplexer output signal 316. As shown at line 510, the divider 308 can operate responsive to (e.g., be triggered based on) a falling edge of the VCO output signal 276. As such, the feedback signal 314 can provide a rising edge in response to a falling edge of the VCO output signal 276.

Absent calibration of the sampler 134 of the locked-loop feedforward path 302, a time offset (T.offset) of unknown duration or length develops. The time offset corresponds to a difference between two edges: an edge of the reference signal 274 and an edge of the feedback signal 314, as shown in FIG. 5. The time offset develops based on a delay introduced by the sampler 134. A length of the time offset can be at least proportional to one or more electrical characteristics, such as an impedance, of the at least one sampler component 318 of the sampler 134. With a sampler 134 that includes at least one resistor and at least one capacitor, the time offset (T offset) can be proportional to a resistance value (Rs) and a capacitance value (Cs) of the sampler 134 (e.g., T.offset=Rs·Cs·ln(2)).

In some implementations, the at least one sampler component 318 is adjusted so as to cause the time offset to track the output frequency of the VCO output signal 276. For example, the time offset can be adjusted to be substantially equal to approximately one-half a period of the VCO output signal 276. In operation, the sampler calibrator 132 adjusts the sampler 134 to substantially align an edge of the VCO output signal 276 with an edge of the reference signal 274, as indicated at line 504. For instance, an impedance of the at least one sampler component 318 can be adjusted to move an edge 506-2 of the VCO output signal 276 in the direction of the arrow 508 to substantially align the edge 506-2 with an edge 506-1 of the reference signal 274.

In this context, two edges can be substantially aligned if they are aligned to a degree feasible with the circuitry, process technology, and frequencies being used, if they are aligned with 10-20%, some combination thereof, and so forth. By aligning these two edges, and shrinking or stretching the cycles of the VCO output signal 276, a next inserted edge from the reference signal 274 can occur near in time to when a next edge of the VCO output signal 276 would have been forwarded without the edge resetting performed by the multiplexer 306. By reducing the timing difference or discrepancy between the edge 506-2 of the VCO output signal 276 and the edge 506-1 of the reference signal 274, reference spurs in the VCO output signal 276 are reduced, and the VCO output signal 276 provides a higher quality oscillating signal.

With reference also to FIGS. 3 and 4, the divider 308 produces the feedback signal 314 based on the VCO output signal 276. The VCO output signal 276 is associated with a VCO output signal period, which corresponds to a length or duration of each cycle. The time offset (T.offset) corresponds to an elapsed time between an edge of the feedback signal 314 and an edge of the reference signal 274, as indicated in the lower portion of the signal diagram 500. The sampler calibrator 132 can therefore adjust at least one impedance of at least one sampler component 318 based on the time offset and the VCO output signal period.

Figure 6:
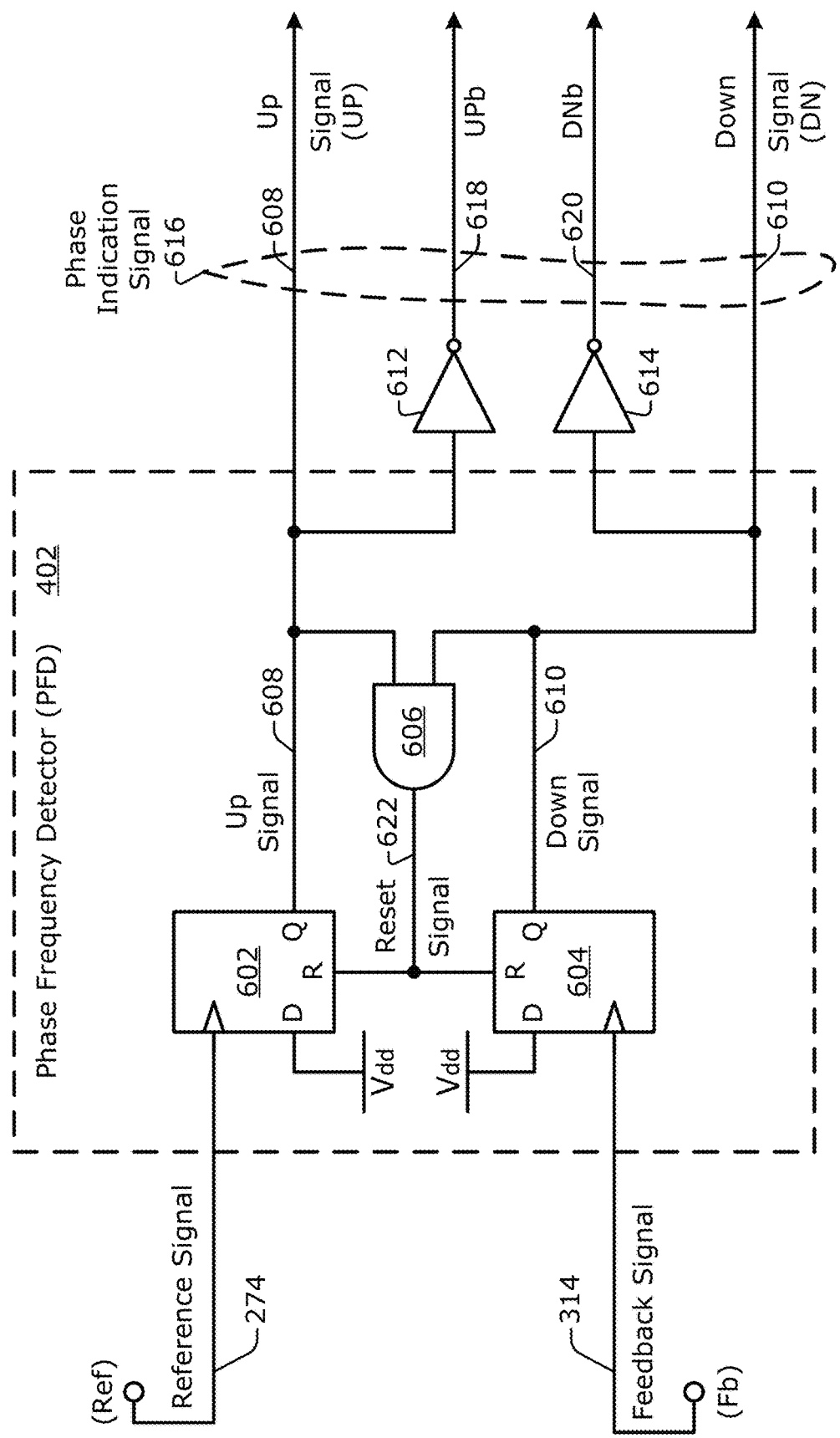
FIG. 6 illustrates example circuitry for a phase-frequency detector (PFD) of a sampling-based locked-loop feedforward path.

FIG. 6 illustrates, at 600 generally, example circuitry for a phase-frequency detector (PFD) 402 of a sampling-based locked-loop feedforward path 302. As shown, the PFD 402 includes two "D" flip-flops, a flip-flop 602 and a flip-flop 604, and an AND gate 606. Each "D" flip-flop includes a "D" input, a "Q" output, a clocking input (">"), and a reset terminal (R). The AND gate 606 includes a first input, a second input, and an output. The PFD 402 accepts as input the reference signal 274 and the feedback signal 314 and outputs the phase indication signal 616. The PFD 402, or related circuitry of the locked-loop feedforward path 302, can also include an inverter 612, an inverter 614, or one or more buffers (not shown) to provide the phase indication signal 616 to the slope generator 750 (e.g., of FIG. 7). As indicated by the dashed-line loop on the right of FIG. 6, the phase indication signal 616 can include one or more of: an up signal 608 (UP), a down signal 610 (DN), an inverted up signal 618 (UPb), or an inverted down signal 620 (DNb).

The "D" input of the flip-flop 602 is coupled to a supply voltage (Vdd). The reference signal 274 is coupled to the clocking input of the flip-flop 602. The "Q" output of the flip-flop 602 produces the up signal 608 that is provided to the slope generator 750 as part of the phase indication signal 616. The up signal 608 is also coupled to the first input of the AND gate 606. The output of the AND gate 606 is coupled to the reset terminal (R) of the flip-flop 602. The "D" input of the flip-flop 604 is coupled to the supply voltage (Vdd). The feedback signal 314 is coupled to the clocking input of the flip-flop 604. The "Q" output of the flip-flop 604 produces the down signal 610 that is provided to the slope generator 750 as another part of the phase indication signal 616. The down signal 610 is coupled to the second input of the AND gate 606. The output of the AND gate 606 is also coupled to the reset terminal (R) of the flip-flop 604. As described next, the flip-flop 602 and the flip-flop 604 are configured to produce the up signal 608 and the down signal 610 responsive to a relative timing of an edge of the reference signal 274 and another edge of the feedback signal 314.

In operation, the two edge-triggered clocking inputs of the flip-flops 602 and 604 work in conjunction with the "D" inputs and the reset terminals (R) thereof using a feedback path (not separately indicated) that is internal to the PFD 402. This internal PFD feedback path includes the AND gate 606 and loops back to the flip-flops 602 and 604. When the reference signal 274 and the feedback signal 314 are both high, the previous rising edge of each of these two signals triggered the flip-flops 602 and 604, which caused both the up signal 608 and the down signal 610, respectively, to be high because the "D" inputs are tied high to the supply voltage (Vdd). This causes the AND gate 606 to output a high signal, which acts as a reset signal 622 that triggers the respective reset terminal (R) of each of the flip-flop 602 and the flip-flop 604. Thus, responsive to a high level of the reset signal 622 at the respective reset terminal (R), the flip-flop 602 changes the corresponding "Q" output to be low, and therefore causes the up signal 608 to have a low value.

Similarly, the flip-flop 604 changes the corresponding "Q" output to be low, and thus causes the down signal 610 to have a low value responsive to a high level of the reset signal 622 at the respective reset terminal (R) of the flip-flop 604. Next, whichever incoming signal—either the reference signal 274 or the feedback signal 314—goes high first, the signal at the corresponding "Q" output will likewise be driven high first. For instance, if the reference signal 274 goes high first, then the "Q" output of the flip-flop 602 goes high to drive the up signal 608 high. Conversely, if the feedback signal 314 goes high first, then the "Q" output of the flip-flop 604 goes high to drive the down signal 610 high. Thus, whichever output signal of the two flip-flops goes high first will remain high until the other incoming signal to the two flip-flops also goes high, thereby causing the AND gate 606 to trigger the reset terminals (R) via the reset signal 622.

Due to the interactions between the two flip-flops and the AND gate, the up signal 608 and the down signal 610 are jointly indicative over time of both the phase difference and the frequency difference between the reference signal 274 and the feedback signal 314. While the PFD 402 is detecting both the phase difference and the frequency difference, the PFD 402 is also directly producing the up signal 608 and the down signal 610 to indicate either or both of these differences over time. Further, the inverter 612 and the inverter 614 are producing inverted versions of these up and down signals. Specifically, the inverter 612 receives the up signal 608, inverts a value thereof, and outputs the inverted up signal 618. Similarly, the inverter 614 receives the down signal 610, inverts a value thereof, and outputs the inverted down signal 620. Any portion or portions of the phase indication signal 616 can be forwarded to the slope generator 750 for further processing. Example implementations of how the slope generator 750 receives and processes the phase indication signal 616 to at least partially realize a sampling-based locked-loop feedforward path 302 are described with reference to FIG. 7.

FIG. 7 illustrates, at 700 generally, example circuitry for a slope generator 750 of a sampler 134 of a sampling-based locked-loop feedforward path 302. As shown, the slope generator 750 receives as input one or more portions of the phase indication signal 616 and the reference signal 274. Based on these input signals, the slope generator 750 generates the slope signal 752. The slope generator 750 processes the input signals to produce the slope signal 752 to indicate whether the reference signal 274 leads or lags the feedback signal 314 at some particular moment. In some implementations, the slope signal 752 is realized using differential signaling, such as with a plus slope signal 710 and a minus slope signal 712.

As shown, the slope generator 750 includes multiple components arranged in two stacks that are coupled between the supply voltage (Vdd) and an equipotential node, such as ground 714. Each stack includes two transistors and one resistor, which can be adjustable. In some implementations, each transistor is implemented as a field-effect transistor (FET), such as a p-channel FET (PFET) or an n-channel FET (NFET). Thus, each transistor includes a respective gate terminal, source terminal, and drain terminal.

A first stack of components 736 includes a transistor 716, a resistor 718 (Rs), and a transistor 720. The transistor 716, the resistor 718, and the transistor 720 are coupled together in series with the transistor 716 coupled to the supply voltage (Vdd) and the transistor 720 coupled to the ground 714. A second stack of components 738 includes a transistor 722, a resistor 724 (Rs), and a transistor 726. The transistor 722, the resistor 724, and the transistor 726 are coupled together in series with the transistor 722 coupled to the supply voltage (Vdd) and the transistor 726 coupled to the ground 714. As shown, the transistors that are coupled to the supply voltage (Vdd) can be implemented using a PFET, and the transistors that are coupled to the ground 714 can be implemented using an NFET. A respective source terminal of each of the transistor 716 and the transistor 722 is coupled to the supply voltage (Vdd). Analogously, a respective source terminal of each of the transistor 720 and the transistor 726 is coupled to the ground 714.

A node 734 is located between the resistor 724 and the transistor 726. A capacitor 730 (Cs), which may be adjustable, is coupled between the node 734 and the ground 714. A node 732 is located between the transistor 716 and the resistor 718. A capacitor 728 (Cs), which may be adjustable, is coupled between the node 732 and the ground 714. The slope generator 750 provides the plus slope signal 710 at the node 734 and the minus slope signal 712 at the node 732. The slope generator 750 produces these slope signal outputs based on multiple input signals, including based on up and down signals 608, 610, 618, or 620 received from the PFD 402 and on the reference signal 274.

The slope generator 750 receives these input signals at gate terminals of the transistors via logic gates and processes the input signals using the first and second stacks of components 736 and 738. As illustrated, the logic gates include a NAND gate 702, an AND gate 704, an inverter 706, and an inverter 708. Generally, outputs of the NAND gate 702 and the AND gate 704 are provided to the transistors of the first stack of components 736, and inverted outputs of the NAND gate 702 and the AND gate 704 are provided via a cross-coupling routing to the transistors of the second stack of components 738. Specifically, an output of the NAND gate 702 is provided to a gate terminal of the transistor 716, and an inverted output of the NAND gate 702 is provided to a gate terminal of the transistor 726 via the inverter 708. Also, an output of the AND gate 704 is provided to a gate terminal of the transistor 720, and an inverted output of the AND gate 704 is provided to a gate terminal of the transistor 722 via the inverter 706.

In some implementations, the slope generator 750 accepts four different input signals, two at each of the NAND gate 702 and the AND gate 704. The NAND gate 702 receives at a first input thereof an inverted version of the reference signal 274—or inverted reference signal (Refb)—and at a second input thereof the inverted down signal 620 (DNb). The AND gate 704 receives at a first input thereof the inverted up signal 618 (UPb) and at a second input thereof the down signal 610 (DN). The outputs of the NAND gate 702 and the AND gate 704 cause the transistors to turn on or off (e.g., to act like a closed switch or like an open switch, respectively) to establish particular voltage levels at the node 732 and the node 734. These voltage levels change at a rate that is at least partially controlled by an interaction between the resistors Rs and the capacitors Cs. This rate of change for the voltages corresponds to a delay rate introduced into the locked-loop feedforward path 302 by the slope generator 750 of the sampler 134. The resistors Rs or the capacitors Cs, including both, can be adjusted to calibrate operation of the sampler 134 as described herein.

The slope generator 750 can also implement a pre-charging functionality. If so, the transistor 716 and the transistor 726 each respectively comprise a pre-charge circuit to provide the pre-charging functionality. Each pre-charge circuit is configured to establish a "default" voltage level for the slope signal 752. The transistor 716 is coupled to the node 732 to establish an initial voltage level for the minus slope signal 712. The transistor 726 is coupled to the node 734 to establish an initial voltage level for the plus slope signal 710. These pre-charge circuits are coupled directly or indirectly to the pre-charge node 740 (PC Node) at the output of the NAND gate 702. Thus, each pre-charge circuit operates responsive to a voltage level at the pre-charge node 740.

In some implementations, the node 732 for the minus slope signal 712 is pre-charged to a high voltage level, such as by pulling a voltage thereof up to the supply voltage (Vdd). On the other hand, the node 734 for the plus slope signal 710 is pre-charged to a low voltage level, such as by pulling a voltage thereof down to the ground 714. These example initial voltage levels enable the changing voltages to decay or otherwise change in a predictable manner or rate. To establish a high voltage level at the node 732, the transistor 716 is implemented as a pull-up transistor (e.g., a PFET) coupled between the supply voltage (Vdd) and the node 732. This pull-up transistor 716 is turned on if a pre-charge signal (PC) has a low voltage level, as provided from the pre-charge node 740 (PC Node).

To establish a low voltage level at the node 734, the transistor 726 is implemented as a pull-down transistor (e.g., an NFET) coupled between the node 734 and the ground 714. This pull-down transistor 726 is turned on if the pre-charge signal (PC) has a low voltage level because the pre-charge signal (PC) is inverted by the inverter 708 to produce a high voltage level at the gate terminal of the transistor 726. Thus, the voltage pre-charging is performed by the pre-charge circuits realized by the transistors 716 and 726 if both the inverted reference signal (Refb) and the inverted down signal 620 (DNb) have a high voltage level at the inputs to the NAND gate 702. The initial high voltage for the minus slope signal 712 and the initial low voltage for the plus slope signal 710 can be established via pre-charging if the reference signal 274 and the down signal 610 are both low.

Thus, based on the input signals received at the NAND gate 702 and the AND gate 704, the slope generator 750 establishes voltage levels at the node 732 and the node 734. The pre-charge circuits realized by the transistors 716 and 726 establish initial voltage levels that can also be applied to, or permitted to continue in, a situation in which the reference signal 274 leads the feedback signal 314. However, as the relative phase difference between these two signals changes, the slope generator 750 changes the voltage levels at the node 732 and the node 734 in accordance with an RC time constant or "decay rate," as described herein. These voltage levels are provided as the minus slope signal 712 and the plus slope signal 710, respectively. The minus slope signal 712 and the plus slope signal 710 are forwarded as the slope signal 752 to the sampling circuit 802 for sampling, as is described below with reference to FIG. 8.

With reference also to FIGS. 3 and 4, the sampler calibrator 132 can provide at least one sampler calibration signal 310 to at least one sampler component 318 to change an impedance value thereof. For the slope generator 750, the resistor 718, the resistor 724, the capacitor 728, or the capacitor 730 can comprise at least one sampler component 318. Thus, the slope generator 750 can include at least one of an adjustable resistor (Rs) or an adjustable capacitor (Cs). The calibrator output node 346 is coupled to at least one of the adjustable resistor or the adjustable capacitor. In operation, the sampler calibrator 132 adjusts at least one of the adjustable resistor or the adjustable capacitor to change a time constant, such as an RC time constant, of the slope generator 750.

Figure 8:
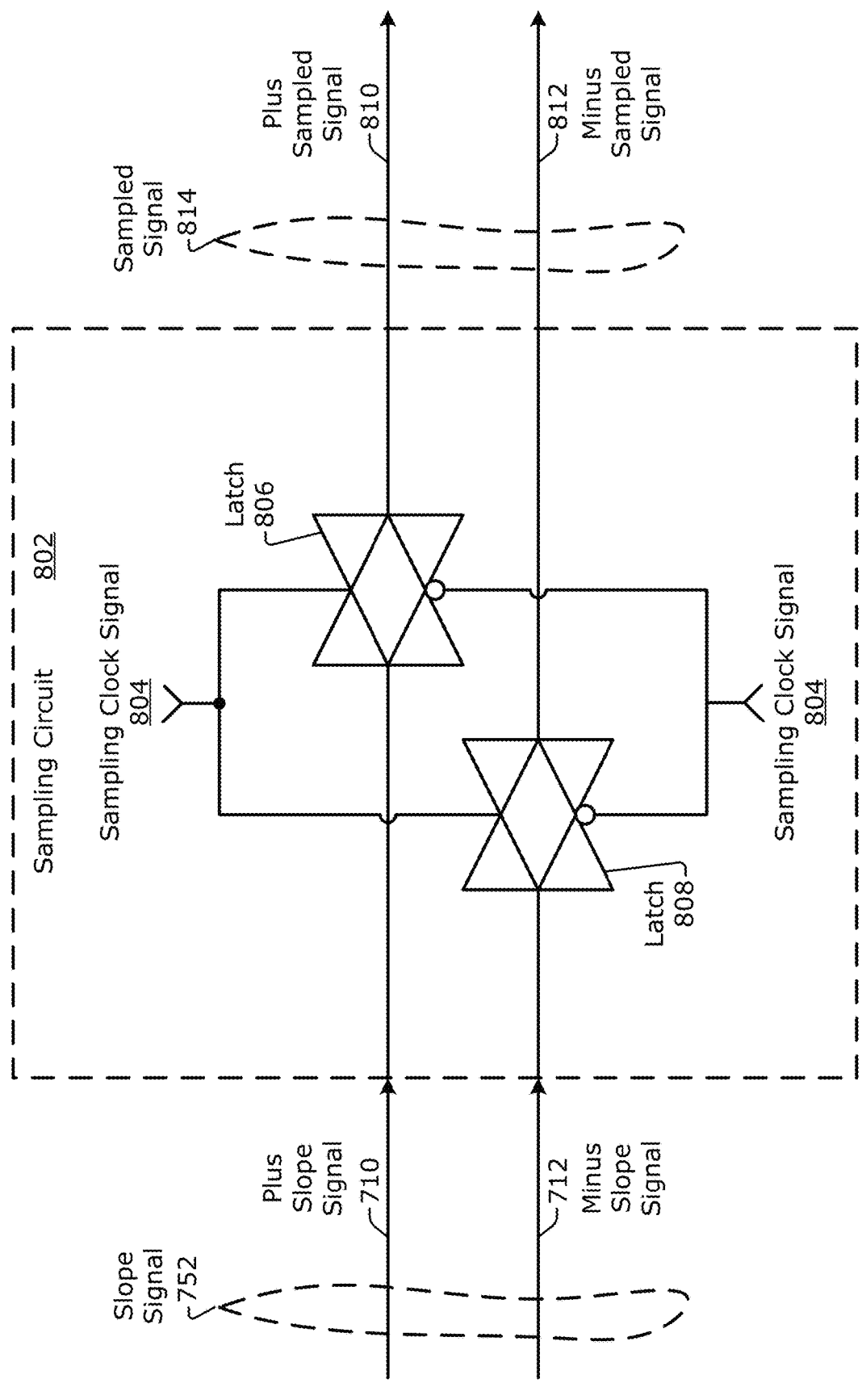
FIG. 8 illustrates example circuitry for a sampling circuit of a sampler of a sampling-based locked-loop feedforward path.

FIG. 8 illustrates, at 800 generally, example circuitry for a sampling circuit 802 of a sampler 134 of a sampling-based locked-loop feedforward path 302. In example implementations, the sampling circuit 802 receives the slope signal 752, samples the slope signal 752, and outputs a sampled signal 814 based on the sampling. Here, both the slope signal 752 and the sampled signal 814 are implemented with differential signaling. The sampled signal 814 therefore includes a plus sampled signal 810 and a minus sampled signal 812. Generally, the sampling circuit 802 samples the plus slope signal 710 to produce the plus sampled signal 810 and samples the minus slope signal 712 to produce the minus sampled signal 812.

As illustrated, the sampling circuit 802 includes at least two latches 806 and 808. The sampling circuit 802 includes a plus differential signal pathway and a minus differential signal pathway. With regard to the plus differential signal pathway in the upper half of FIG. 8, the latch 806 is coupled between the slope generator 750 (of FIG. 7) and the transconductance amplifier 404 (of FIGS. 4 and 9). With regard to the minus differential signal pathway in the lower half of FIG. 8, the latch 808 is coupled between the slope generator 750 (of FIG. 7) and the transconductance amplifier 404 (of FIGS. 4 and 9).

In an example operation, a sampling clock signal 804 controls when the latch 806 samples the plus slope signal 710 and when the latch 808 samples the minus slope signal 712. Responsive to a pulse or an edge of a pulse of the sampling clock signal 804, the latches 806 and 808 jointly sample the slope signal 752 to obtain the sampled signal 814. Based on the sampling clock signal 804, the latch 806 secures the present value of the plus slope signal 710 as a value for the plus sampled signal 810. Similarly, the latch 808 secures the present value of the minus slope signal 712 as a value for the minus sampled signal 812 based on the sampling clock signal 804. Thus, the slope generator 750 (of FIG. 7) and the sampling circuit 802 (of FIG. 8) can jointly implement at least part of the sampler 134 (e.g., of FIGS. 1, 3, and 4) of a sampling-based locked-loop feedforward path 302.

Figure 9:
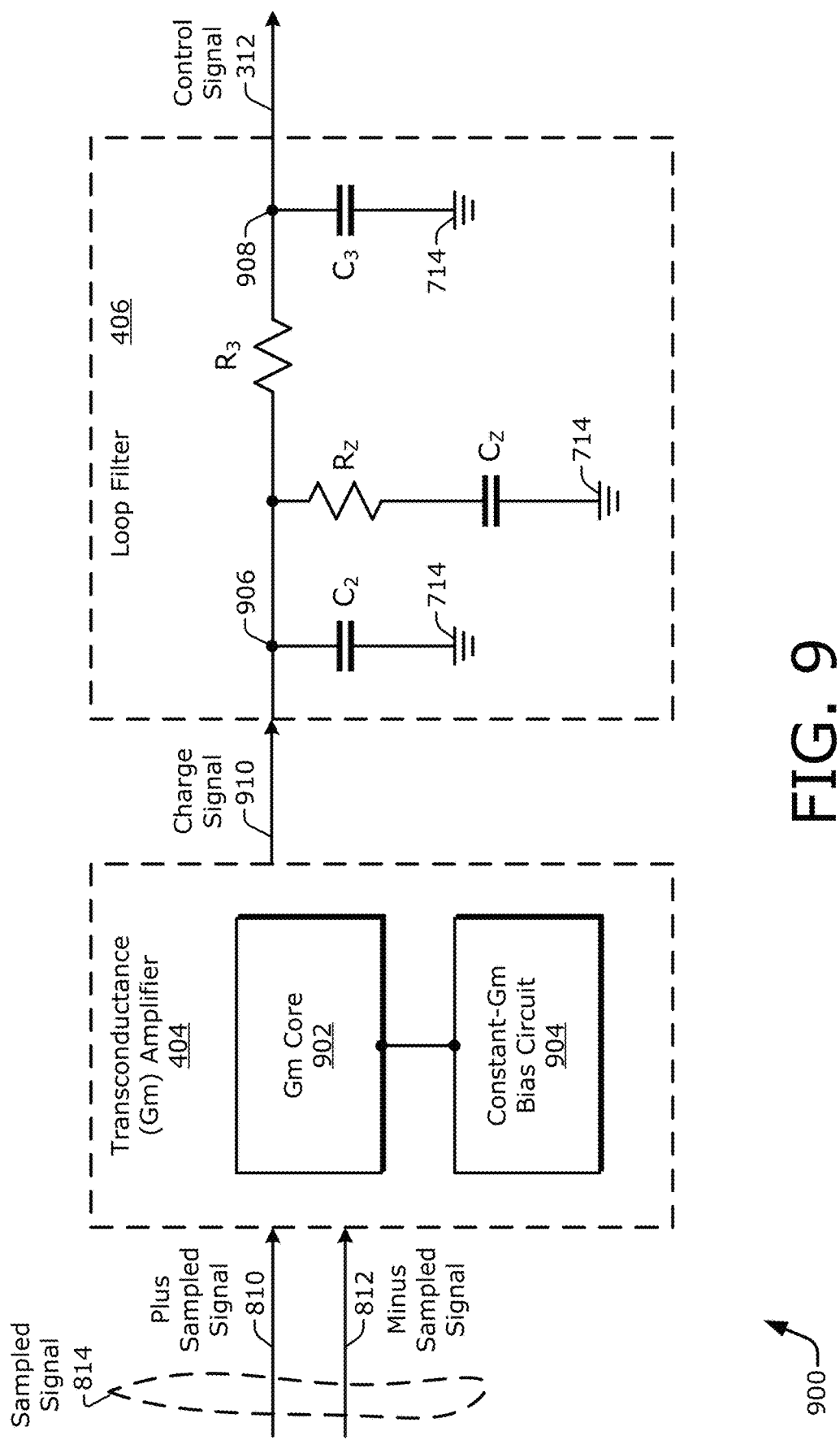
FIG. 9 illustrates example circuitry for a transconductance (Gm) amplifier and example circuitry for a loop filter of a sampling-based locked-loop feedforward path.

FIG. 9 illustrates, at 900 generally, example circuitry for a transconductance (Gm) amplifier 404 (Gm 404) and example circuitry for a loop filter 406 of a sampling-based locked-loop feedforward path 302. The transconductance amplifier 404 receives the plus sampled signal 810 and the minus sampled signal 812 of the sampled signal 814. In example operations, the transconductance amplifier 404 determines a voltage difference between the plus sampled signal 810 and the minus sampled signal 812, which both comprise voltage-based signals. For example, the transconductance amplifier 404 can subtract a voltage level of the plus sampled signal 810 from a voltage level of the minus sampled signal 812 to determine a voltage difference between the two voltage-based signals. The transconductance amplifier 404 amplifies this voltage differential and converts the voltage-based sampled signal 814 to a current-based signal to produce a charge signal 910.

In example implementations, the transconductance amplifier 404 includes a Gm core 902 and a constant-Gm bias circuit 904. The Gm core 902 is coupled to the constant-Gm bias circuit 904. The Gm core 902 can have a programmable Gm scaling factor. In operation, the Gm core 902 performs the transconductance amplification to produce the charge signal 910 based on the plus sampled signal 810 and the minus sampled signal 812. The constant-Gm bias circuit 904 operates to provide a constant Gm value across different PVT conditions.

Using a transconductance amplifier 404 as described herein can result in a number of features. First, with respect to implementing differential signaling, voltage supply noise in the slope generator 750 can be canceled out due to the differential sampling. Additionally, charge injection and clock feedthrough in the sampling latches 806 and 808 may appear as a common mode at the differential inputs of the Gm core 902. Thus, the effects of the charge injection and clock feedthrough can be canceled out at the output of the transconductance amplifier 404, which leads to lower reference spurs. Second, by using a Gm-cell instead of an operational amplifier, issues related to a finite gain and gain bandwidth of an operational amplifier can be at least reduced. Third, with the constant-Gm bias circuit 904, the Gm can be designed to be proportional to 1/Rgm, where Rgm is the resistance of the Gm core 902.

In example implementations, the loop filter 406 receives the charge signal 910 in the form of a positive current or a negative current that increases or decreases a voltage across a filter capacitor thereof. This voltage can be provided by the loop filter 406 to the ring VCO 304 as the control signal 312. The filter capacitor of the loop filter 406 can include one or more capacitors, such as a capacitor C2, a capacitor C3, or a capacitor Cz, as illustrated. The loop filter 406 can also include at least one resistor, such as a resistor R3 or a resistor Rz.

As shown, the loop filter 406 includes an input node 906 and an output node 908. The output node 908 can correspond to the control output node 324 of the locked-loop feedforward path 302 (of FIG. 3). The capacitor C2 is coupled between the input node 906 and the ground 714. The resistor Rz and the capacitor Cz are coupled together in series between the input node 906 and the ground 714, with the capacitor Cz coupled between the resistor Rz and the ground 714. The resistor R3 is coupled between the input node 906 and the output node 908. The capacitor C3 is coupled between the output node 908 and the ground 714. The loop filter 406 may, however, be implemented in any of many alternative manners, e.g., to filter the charge signal 910 from the transconductance amplifier 404. For example, between the input node 906 and the output node 908, the loop filter 406 may include different components, more or fewer components, different connections between components, and so forth.

FIG. 10 illustrates, at 1000 generally, example components of a sampler calibrator 132. The sampler calibrator 132 is coupled to an example portion of a locked-loop feedforward path 302 (e.g., of FIGS. 3, 4, and 7). More specifically, example implementations of a sampler component 318 (e.g., of FIGS. 3 and 4) of a sampler 134 are depicted. Here, at least one sampler component 318 can include a resistor 718 (Rs) or a resistor 724 (Rs). Additionally or alternatively, the at least one sampler component 318 can include one or more capacitors 728 (Cs) and one or more capacitors 730 (Cs). The capacitors 728 and 730 are implemented in an example differential arrangement. Two minus capacitors 728-1 and 730-1 are coupled together in series between the node 732 and the node 734. Similarly, two plus capacitors 728-2 and 730-2 are coupled together in series between the nodes 732 and 734.

In example implementations, each sampler component 318 is adjustable, which can include a sampler resistor Rs or a sampler capacitor Cs. Hence, each of the resistors 718 and 724 can be realized with a respective adjustable resistor. Each respective capacitor of the minus capacitors 728-1 and 730-1 and each respective capacitor of the plus capacitors 728-2 and 730-2 can be realized with at least one adjustable capacitor. These adjustable components can be formed, for example, using an array of non-adjustable components (e.g., fixed-value resistive components or fixed-value capacitive components) that are coupled together in series or in parallel with one or more switches. Additionally or alternatively, each adjustable component can be formed using at least one transistor-based device. For example, each adjustable capacitor can be realized using at least one varactor, as shown in FIG. 10.

With a differential implementation, the DAC 416 can include a plus DAC 416-2 and a minus DAC 416-1. Thus, the DSM 414 or the accumulator 412 can be coupled to the plus DAC 416-2 and the minus DAC 416-1, with one DAC including an inverting input. In some cases, each DAC 416 may be realized using an R2R DAC. The plus DAC 416-2 or the minus DAC 416-1 may be coupled to at least one calibration node 1002 that changes an electrical characteristic, such as an impedance, of the corresponding sampler component 318. With a resistor, the resistance can be changed; with a capacitor, the capacitance can be changed.

In FIG. 10, the plus DAC 416-2 provides a plus sampler calibration signal 310-2 to a plus calibration node 1002-2 to change at least one capacitance of the plus varactors 728-2 and 730-2. The minus DAC 416-1 provides a minus sampler calibration signal 310-1 to a minus calibration node 1002-1 to change at least one capacitance of the minus varactors 728-1 and 730-1. Instead of, or in addition to, adjusting the capacitors, the sampler calibrator 132 can adjust one or more of the resistors as indicated by the short-dashed lines extending from the two DACs 416. The plus DAC 416-2 can provide a plus sampler calibration signal 310-2 to another plus calibration node 1002-2 to change a resistance of the plus resistor 724. The minus DAC 416-1 can provide a minus sampler calibration signal 310-1 to another minus calibration node 1002-1 to change a resistance of the minus resistor 718.

As shown, the plus DAC 416-2 can provide a plus sampler calibration signal 310-2 to at least one plus calibration node 1002-2 to change an impedance of at least one plus sampler component via a plus calibrator output node 346-2. The minus DAC 416-1 can provide a minus sampler calibration signal 310-1 to at least one minus calibration node 1002-1 to change an impedance of at least one minus sampler component via a minus calibrator output node 346-1. The capacitors 728 and 730 (of FIG. 7) may be adjusted in addition to or instead of the varactors 728-1/728-2 and 730-1/730-2 shown in FIG. 10. Although particular example arrangements for realizing at least one sampler component 318 and providing a sampler calibration signal 310 thereto are depicted in FIG. 10 and described above, these aspects can be implemented differently, such as in terms of quantity of components, electrical connections between components, device types, differential versus single-ended circuitry, and so forth.

Figure 11:
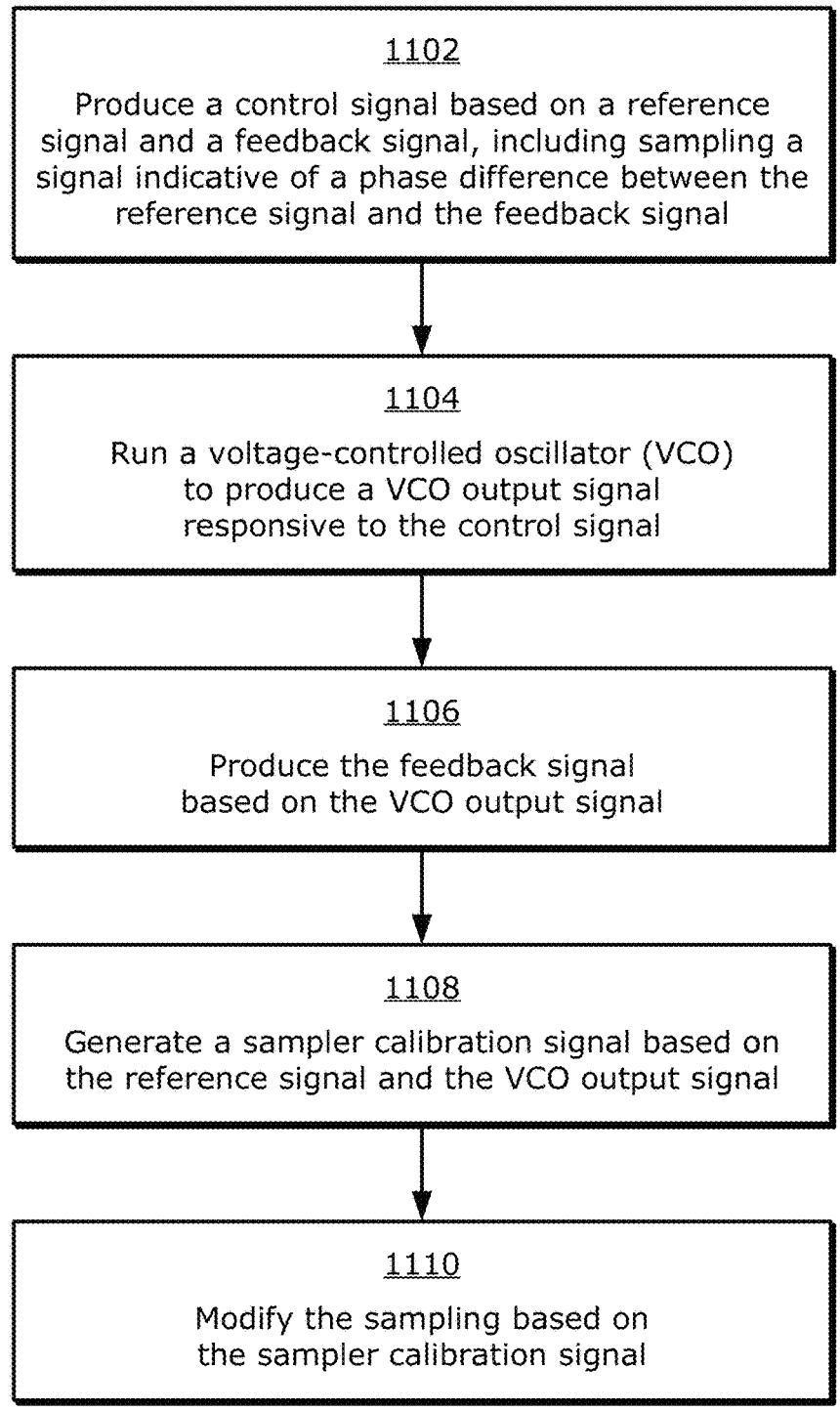
FIG. 11 is a flow diagram illustrating an example process for operating a sampling-based MDLL in conjunction with a sampler calibrator.

FIG. 11 is a flow diagram illustrating an example process 1100 for operating a sampling-based MDLL in conjunction with a sampler calibrator. The process 1100 is described in the form of a set of blocks 1102-1110 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100 or an alternative process. Operations represented by the illustrated blocks of the process 1100 may be performed by an electronic device 102, including by a wireless interface device 120 thereof. More specifically, the operations of the process 1100 may be performed jointly by an MDLL 130 in conjunction with a sampler calibrator 132 that are part of a transceiver 126 or are part of other circuitry of an electronic device.

At block 1102, a control signal is produced based on a reference signal and a feedback signal. The control signal production includes sampling a signal indicative of a phase difference between the reference signal and the feedback signal. For example, the MDLL 130 can produce a control signal 312 based on a reference signal 274 and a feedback signal 314. The production of the control signal 312 can include sampling a signal indicative of a phase difference between the reference signal 274 and the feedback signal 314. To do so, a PFD 402 may produce a phase indication signal 616. A sampler 134, using a slope generator 750 and a sampling circuit 802, may obtain a sampled signal 814 based on the phase indication signal 616. Further, a transconductance amplifier 404 (Gm 404) or a loop filter 406 may produce the control signal 312 based on the sampled signal 814.

At block 1104, a voltage-controlled oscillator (VCO) is run to produce a VCO output signal responsive to the control signal. For example, the MDLL 130 can run a VCO, such as a ring VCO 304, to produce a VCO output signal 276 responsive to the control signal 312. The ring VCO 304 may propagate a signal through multiple delay elements, such as multiple inverters 408-1 to 408-N, with each delay element providing a delay that is proportional to a value of the control signal 312.

At block 1106, the feedback signal is produced based on the VCO output signal. For example, the MDLL 130 can produce the feedback signal 314 based on the VCO output signal 276. In some cases, a divider 308 may divide the VCO output signal 276 by a divider value "D" to lower a frequency of the VCO output signal 276 to produce the feedback signal 314.

At block 1108, a sampler calibration signal is generated based on the reference signal and the VCO output signal. For example, the sampler calibrator 132 can generate a sampler calibration signal 310 based on the reference signal 274 and the VCO output signal 276. For instance, a phase detector, such as a BBPD 410, may detect a phase difference between the reference signal 274 and the VCO output signal 276. Further, using an accumulator 412 and a DAC 416, the sampler calibrator 132 may generate the sampler calibration signal 310 based on the detected phase difference.

At block 1110, the sampling is modified based on the sampler calibration signal. For example, the MDLL 130 or the sampler calibrator 132 can modify the sampling of the signal indicative of the phase difference based on the sampler calibration signal 310. To do so, the sampler calibrator 132 may couple the sampler calibration signal 310 to at least one sampler component 318 of the sampler 134. In response to the sampler calibration signal 310, the slope generator 750 may adjust an impedance of at least one component, like a resistance of an adjustable resistor or a capacitance of an adjustable capacitor, that is being used to sample the phase indication signal 616.

This section describes some aspects of example implementations and/or example configurations related to the apparatuses and processes presented above.

Example aspect 1: An apparatus comprising:
a multiplying delay-locked loop (MDLL) comprising:
 a locked-loop feedforward path comprising a sampler, a control output node, a feedback input node, and a reference input node coupled to a reference signal source;
 a voltage-controlled oscillator (VCO) comprising a VCO input node, a VCO output node, and a control input node coupled to the control output node;
 a multiplexer comprising a first input node, a second input node, and an output node, the first input node coupled to the reference signal source, the second input node coupled to the VCO output node, and the output node coupled to the VCO input node; and
 a divider comprising a divider input node and a divider output node, the divider input node coupled to the VCO output node, and the divider output node coupled to the feedback input node; and
a sampler calibrator comprising a first calibrator input node, a second calibrator input node, and a calibrator output node, the first calibrator input node coupled to the reference signal source, the second calibrator input node coupled to the VCO output node, and the calibrator output node coupled to the sampler.

Example aspect 2: The apparatus of example aspect 1, wherein:
the sampler comprises a sampler component; and
the calibrator output node is coupled to the sampler component.

Example aspect 3: The apparatus of example aspect 2, wherein the sampler component comprises at least one of:
an adjustable capacitor; or an adjustable resistor.

Example aspect 4: The apparatus of example aspect 3, wherein:
the sampler component comprises at least one adjustable capacitor; and
the at least one adjustable capacitor comprises at least one varactor.

Example aspect 5: The apparatus of example aspect 2, wherein:

the sampler component is associated with at least one impedance; and the sampler calibrator is configured to adjust the at least one impedance based on a reference signal provided by the reference signal source and a VCO output signal generated by the VCO.

Example aspect 6: The apparatus of example aspect 5, wherein a delay rate of the sampler is based at least partly on the at least one impedance of the sampler component.

Example aspect 7: The apparatus of example aspect 5 or example aspect 6, wherein the sampler calibrator is configured to adjust the at least one impedance to substantially align an edge of the VCO output signal with an edge of the reference signal.

Example aspect 8: The apparatus of example aspect 5 or either one of example aspect 6 or 7, wherein:

the VCO output signal is associated with a VCO output signal period;

the divider is configured to produce a feedback signal based on the VCO output signal;

a time offset corresponds to an elapsed time between an edge of the feedback signal and an edge of the reference signal; and the sampler calibrator is configured to adjust the at least one impedance based on the time offset and the VCO output signal period.

Example aspect 9: The apparatus of example aspect 1 or any one of the other preceding example aspects, wherein:

the sampler comprises a sampler input node and a sampler output node; and the locked-loop feedforward path comprises:

a phase-frequency detector (PFD) comprising the feedback input node, the reference input node, and a PFD output node, the PFD output node coupled to the sampler input node; and a loop filter comprising a loop filter input node and the control output node, the loop filter input node coupled to the sampler output node.

Example aspect 10: The apparatus of example aspect 9, wherein the sampler comprises:

a slope generator comprising the sampler input node, the slope generator configured to generate a slope signal based on a phase indication signal provided by the PFD; and a sampling circuit comprising the sampler output node, the sampling circuit coupled to the slope generator and configured to produce a sampled signal based on the slope signal.

Example aspect 11: The apparatus of example aspect 10, wherein:

the slope generator comprises at least one of an adjustable resistor or an adjustable capacitor;

the calibrator output node is coupled to at least one of the adjustable resistor or the adjustable capacitor; and the sampler calibrator is configured to adjust at least one of the adjustable resistor or the adjustable capacitor to change a time constant of the slope generator.

Example aspect 12: The apparatus of example aspect 1 or any one of the other preceding example aspects, wherein:

the VCO comprises a ring VCO;

the control input node of the ring VCO comprises multiple control input nodes; and the ring VCO comprises multiple inverters coupled together in series between the VCO input node and the VCO output node, each respective inverter of the multiple inverters comprising a respective control input node of the multiple control input nodes.

Example aspect 13: The apparatus of example aspect 1 or any one of the other preceding example aspects, wherein the sampler calibrator comprises:

a phase detector comprising the first calibrator input node, the second calibrator input node, and a phase-detector output node that is coupled to the calibrator output node.

Example aspect 14: The apparatus of example aspect 13, wherein the phase detector comprises a bang-bang phase detector (BBPD).

Example aspect 15: The apparatus of example aspect 13 or example aspect 14, wherein the sampler calibrator comprises:

a digital-to-analog converter (DAC) comprising the calibrator output node and a DAC input node; and an accumulator coupled between the phase-detector output node and the DAC input node.

Example aspect 16: The apparatus of example aspect 15, wherein the sampler calibrator comprises:

a delta-sigma modulator (DSM) coupled between the accumulator and the DAC input node.

Example aspect 17: The apparatus of example aspect 1 or any one of the other preceding example aspects, further comprising:

a phase-locked loop (PLL) core including a reference signal input node, wherein:

the reference signal source comprises a crystal oscillator configured to generate a reference signal; and the VCO output node is coupled to the reference signal input node of the PLL core.

Example aspect 18: The apparatus of example aspect 1 or any one of the other preceding example aspects, further comprising:

at least one antenna; and a wireless interface device coupled to the at least one antenna, the wireless interface device comprising the MDLL.

Example aspect 19: The apparatus of example aspect 18, further comprising:

a display screen; and at least one processor operatively coupled to the display screen and at least a portion of the wireless interface device, the at least one processor configured to present one or more graphical images on the display screen based on one or more wireless signals communicated via the at least one antenna using the MDLL of the wireless interface device.

Example aspect 20: An apparatus for calibrating a multiplying delay-locked loop (MDLL), the apparatus comprising:

a locked-loop feedforward path comprising:

a phase-frequency detector (PFD) configured to produce a phase indication signal based on a reference signal and a feedback signal; and means for sampling the phase indication signal to produce a sampled signal;

a voltage-controlled oscillator (VCO) coupled to the locked-loop feedforward path and configured to generate, responsive to the sampled signal, a VCO output signal at a VCO output node;

a divider coupled to the VCO output node and configured to produce the feedback signal based on the VCO output signal;

a multiplexer coupled to a VCO input node and configured to selectively forward the reference signal or the VCO output signal to the VCO input node; and calibration means for calibrating the means for sampling based on the reference signal and the VCO output signal.

Example aspect 21: The apparatus of example aspect 20, wherein:

the locked-loop feedforward path comprises a loop filter configured to filter the sampled signal to produce a control signal;

the VCO is configured to generate, responsive to the control signal, the VCO output signal at the VCO output node; and the means for sampling comprises means for establishing a time constant corresponding to at least one slope signal.

Example aspect 22: The apparatus of example aspect 21, wherein the calibration means comprises:

means for determining a phase difference between the reference signal and the VCO output signal; and accumulation means for tracking the phase difference over time, the accumulation means coupled to the means for establishing a time constant.

Example aspect 23: The apparatus of example aspect 20 or either one of example aspect 21 or 22, wherein the calibrations means comprises:

means for adjusting at least one impedance of the means for sampling to substantially align an edge of the VCO output signal with an edge of the reference signal.

Example aspect 24: A method for operating a multiplying delay-locked loop (MDLL), the method comprising:

producing a control signal based on a reference signal and a feedback signal, including sampling a signal indicative of a phase difference between the reference signal and the feedback signal;

running a voltage-controlled oscillator (VCO) to produce a VCO output signal responsive to the control signal;

producing the feedback signal based on the VCO output signal;

generating a sampler calibration signal based on the reference signal and the VCO output signal; and modifying the sampling based on the sampler calibration signal.

Example aspect 25: The method of example aspect 24, wherein the producing the feedback signal comprises:

producing the feedback signal responsive to a falling edge of the VCO output signal.

Example aspect 26: The method of example aspect 24 or example aspect 25, wherein the generating comprises:

generating the sampler calibration signal to substantially align an edge of the VCO output signal with an edge of the reference signal.

Example aspect 27: The method of example aspect 24 or either one of example aspect 25 or 26, wherein:

the sampling comprises obtaining, using at least one sampler component, a sampled signal based on the signal indicative of the phase difference between the reference signal and the feedback signal; and the modifying comprises adjusting an impedance of the at least one sampler component using the sampler calibration signal.

Example aspect 28: The method of example aspect 24 or any one of example aspects 25-27, wherein the generating comprises:

detecting a binary phase difference between the reference signal and the VCO output signal;

accumulating the binary phase difference over time; and generating the sampler calibration signal responsive to the accumulating.

Example aspect 29: An apparatus comprising:

a multiplying delay-locked loop (MDLL) comprising:

a voltage-controlled oscillator (VCO) configured to generate a VCO output signal based on the VCO output signal and a reference signal and responsive to a control signal, the VCO output signal having an output frequency that is a multiple of a reference frequency of the reference signal;

a divider configured to produce a feedback signal based on the VCO output signal;

a phase-frequency detector (PFD) configured to produce a phase indication signal based on the reference signal and the feedback signal; and a sampler configured to produce a sampled signal based on the phase indication signal, the control signal based on the sampled signal; and a sampler calibrator configured to provide a sampler calibration signal to the sampler based on the reference signal and the VCO output signal.

Example aspect 30: The apparatus of example aspect 29, wherein the sampler calibrator is configured to adjust an impedance of at least one component of the sampler using the sampler calibration signal to substantially align an edge of the VCO output signal with an edge of the reference signal.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:

a multiplying delay-locked loop (MDLL) comprising:

a locked-loop feedforward path comprising a control output node, a feedback input node, a reference input node coupled to a reference signal source, and a sampler comprising a sampler component that is associated with at least one impedance;

a voltage-controlled oscillator (VCO) comprising a VCO input node, a VCO output node, and a control input node coupled to the control output node;

a multiplexer comprising a first input node, a second input node, and an output node, the first input node coupled to the reference signal source, the second input node coupled to the VCO output node, and the output node coupled to the VCO input node; and a divider comprising a divider input node and a divider output node, the divider input node coupled to the VCO output node, and the divider output node coupled to the feedback input node; and a sampler calibrator comprising a first calibrator input node, a second calibrator input node, and a calibrator output node, the first calibrator input node coupled to the reference signal source, the second calibrator input node coupled to the VCO output node, and the calibrator output node coupled to the sampler component of the sampler, the sampler calibrator configured to adjust the at least one impedance based on a reference signal provided by the reference signal source and a VCO output signal generated by the VCO.

2. The apparatus of claim 1, wherein the sampler component comprises at least one of:
an adjustable capacitor; or
an adjustable resistor.

3. The apparatus of claim 2, wherein:
the sampler component comprises at least one adjustable capacitor; and
the at least one adjustable capacitor comprises at least one varactor.

4. The apparatus of claim 1, wherein the apparatus comprises an electronic device.

5. The apparatus of claim 1, wherein a delay rate of the sampler is based at least partly on the at least one impedance of the sampler component.

6. The apparatus of claim 1, wherein the sampler calibrator is configured to adjust the at least one impedance to substantially align an edge of the VCO output signal with an edge of the reference signal.

7. The apparatus of claim 1, wherein:
the VCO output signal is associated with a VCO output signal period;
the divider is configured to produce a feedback signal based on the VCO output signal;
a time offset corresponds to an elapsed time between an edge of the feedback signal and an edge of the reference signal; and
the sampler calibrator is configured to adjust the at least one impedance based on the time offset and the VCO output signal period.

8. The apparatus of claim 1, wherein:
the sampler comprises a sampler input node and a sampler output node; and
the locked-loop feedforward path comprises:
a phase-frequency detector (PFD) comprising the feedback input node, the reference input node, and a PFD output node, the PFD output node coupled to the sampler input node; and
a loop filter comprising a loop filter input node and the control output node, the loop filter input node coupled to the sampler output node.

9. The apparatus of claim 8, wherein the sampler comprises:
a slope generator comprising the sampler input node, the slope generator configured to generate a slope signal based on a phase indication signal provided by the PFD; and
a sampling circuit comprising the sampler output node, the sampling circuit coupled to the slope generator and configured to produce a sampled signal based on the slope signal.

10. The apparatus of claim 9, wherein:
the slope generator comprises the sampler component, which comprises at least one of an adjustable resistor or an adjustable capacitor;

the calibrator output node is coupled to at least one of the adjustable resistor or the adjustable capacitor; and
the sampler calibrator is configured to adjust at least one of the adjustable resistor or the adjustable capacitor to change a time constant of the slope generator.

11. The apparatus of claim 1, wherein:
the VCO comprises a ring VCO;
the control input node of the ring VCO comprises multiple control input nodes; and
the ring VCO comprises multiple inverters coupled together in series between the VCO input node and the VCO output node, each respective inverter of the multiple inverters comprising a respective control input node of the multiple control input nodes.

12. The apparatus of claim 1, wherein the sampler calibrator comprises:
a phase detector comprising the first calibrator input node, the second calibrator input node, and a phase-detector output node that is coupled to the calibrator output node.

13. The apparatus of claim 12, wherein the phase detector comprises a bang-bang phase detector (BBPD).

14. The apparatus of claim 12, wherein the sampler calibrator comprises:
a digital-to-analog converter (DAC) comprising the calibrator output node and a DAC input node; and
an accumulator coupled between the phase-detector output node and the DAC input node.

15. The apparatus of claim 14, wherein the sampler calibrator comprises:
a delta-sigma modulator (DSM) coupled between the accumulator and the DAC input node.

16. The apparatus of claim 1, further comprising:
a phase-locked loop (PLL) core including a reference signal input node, wherein:
the reference signal source comprises a crystal oscillator configured to generate a reference signal; and
the VCO output node is coupled to the reference signal input node of the PLL core.

17. The apparatus of claim 1, further comprising:
at least one antenna; and
a wireless interface device coupled to the at least one antenna, the wireless interface device comprising the MDLL and the sampler calibrator.

18. The apparatus of claim 17, further comprising:
a display screen; and
at least one processor operatively coupled to the display screen and at least a portion of the wireless interface device, the at least one processor configured to present one or more graphical images on the display screen based on one or more wireless signals communicated via the at least one antenna using the MDLL and the sampler calibrator of the wireless interface device.

19. An apparatus for calibrating a multiplying delay-locked loop (MDLL), the apparatus comprising:
a locked-loop feedforward path comprising:
a phase-frequency detector (PFD) configured to produce a phase indication signal based on a reference signal and a feedback signal; and
means for sampling the phase indication signal to produce a sampled signal using a sampling component associated with at least one impedance;
a voltage-controlled oscillator (VCO) coupled to the locked-loop feedforward path and configured to generate, responsive to the sampled signal, a VCO output signal at a VCO output node;

a divider coupled to the VCO output node and configured to produce the feedback signal based on the VCO output signal;

a multiplexer coupled to a VCO input node and configured to selectively forward the reference signal or the VCO output signal to the VCO input node; and calibration means for calibrating the means for sampling by adjusting the at least one impedance of the sampling component based on the reference signal and the VCO output signal.

20. The apparatus of claim 19, wherein:

the locked-loop feedforward path comprises a loop filter configured to filter the sampled signal to produce a control signal;

the VCO is configured to generate, responsive to the control signal, the VCO output signal at the VCO output node; and the means for sampling comprises means for establishing a time constant corresponding to at least one slope signal.

21. The apparatus of claim 20, wherein the calibration means comprises:

means for determining a phase difference between the reference signal and the VCO output signal; and accumulation means for tracking the phase difference over time, the accumulation means coupled to the means for establishing a time constant.

22. The apparatus of claim 19, wherein the calibrations means comprises:

means for adjusting the at least one impedance of the sampling component of the means for sampling to substantially align an edge of the VCO output signal with an edge of the reference signal.

23. A method for operating a multiplying delay-locked loop (MDLL), the method comprising:

producing a control signal based on a reference signal and a feedback signal, including sampling a signal indicative of a phase difference between the reference signal and the feedback signal to obtain a sampled signal using at least one sampler component;

running a voltage-controlled oscillator (VCO) to produce a VCO output signal responsive to the control signal;

producing the feedback signal based on the VCO output signal;

generating a sampler calibration signal based on the reference signal and the VCO output signal; and modifying the sampling based on the sampler calibration signal, including adjusting an impedance of the at least one sampler component using the sampler calibration signal.

24. The method of claim 23, wherein the producing the feedback signal comprises:

producing the feedback signal responsive to a falling edge of the VCO output signal.

25. The method of claim 23, wherein the generating comprises:

generating the sampler calibration signal to substantially align an edge of the VCO output signal with an edge of the reference signal.

26. The method of claim 23, wherein the adjusting comprises:

changing a time offset between the reference signal and the feedback signal to reduce reference spurs on the VCO output signal.

27. The method of claim 23, wherein the generating comprises:

detecting a binary phase difference between the reference signal and the VCO output signal;

accumulating the binary phase difference over time; and generating the sampler calibration signal responsive to the accumulating.

28. An apparatus comprising:

a multiplying delay-locked loop (MDLL) comprising:

a voltage-controlled oscillator (VCO) configured to generate a VCO output signal based on the VCO output signal and a reference signal and responsive to a control signal, the VCO output signal having an output frequency that is a multiple of a reference frequency of the reference signal;

a divider configured to produce a feedback signal based on the VCO output signal;

a phase-frequency detector (PFD) configured to produce a phase indication signal based on the reference signal and the feedback signal; and a sampler comprising at least one component associated with at least one impedance and configured to produce a sampled signal based on the phase indication signal, the control signal based on the sampled signal; and a sampler calibrator configured to provide a sampler calibration signal to the sampler based on the reference signal and the VCO output signal to adjust the at least one impedance of the at least one component of the sampler.

29. The apparatus of claim 28, wherein the sampler calibrator is configured to adjust the at least one impedance of the at least one component of the sampler using the sampler calibration signal to substantially align an edge of the VCO output signal with an edge of the reference signal.

30. An apparatus comprising:

a multiplying delay-locked loop (MDLL) comprising:

a locked-loop feedforward path comprising a sampler, a control output node, a feedback input node, and a reference input node coupled to a reference signal source;

a voltage-controlled oscillator (VCO) comprising a VCO input node, a VCO output node, and a control input node coupled to the control output node;

a multiplexer comprising a first input node, a second input node, and an output node, the first input node coupled to the reference signal source, the second input node coupled to the VCO output node, and the output node coupled to the VCO input node; and a divider comprising a divider input node and a divider output node, the divider input node coupled to the VCO output node, and the divider output node coupled to the feedback input node; and a sampler calibrator comprising a calibrator output node and a phase detector comprising a first calibrator input node, a second calibrator input node, and a phase-detector output node that is coupled to the calibrator output node; the first calibrator input node coupled to the reference signal source, the second calibrator input node coupled to the VCO output node, and the calibrator output node coupled to the sampler.

31. The apparatus of claim 30, wherein the phase detector comprises a bang-bang phase detector (BBPD).

* * * * *